United States Patent
Pontoppidan et al.

(10) Patent No.: US 9,369,102 B2
(45) Date of Patent: Jun. 14, 2016

(54) METHODS AND APPARATUS FOR PROCESSING AUDIO SIGNALS

(71) Applicant: Oticon A/S, Smørum (DK)

(72) Inventors: Niels Henrik Pontoppidan, Smørum (DK); Thomas Lunner, Smørum (DK); Marianna Vatti, Smørum (DK); Lars Bramsløw, Smørum (DK)

(73) Assignee: OTICON A/S, Smorum (DK)

(*) Notice: Subject to any disclaimer, the term of this patent is extended or adjusted under 35 U.S.C. 154(b) by 0 days.

(21) Appl. No.: 14/808,705

(22) Filed: Jul. 24, 2015

(65) Prior Publication Data

US 2015/0333717 A1 Nov. 19, 2015

Related U.S. Application Data

(63) Continuation of application No. 13/890,001, filed on May 8, 2013, now Pat. No. 9,130,523.

(60) Provisional application No. 61/644,457, filed on May 9, 2012.

(30) Foreign Application Priority Data

May 9, 2012 (EP) .................................. 12167267

(51) Int. Cl.
*H03G 5/00* (2006.01)
*H03G 3/00* (2006.01)
*H04R 25/00* (2006.01)
*H03C 1/00* (2006.01)
*H03C 5/00* (2006.01)
(Continued)

(52) U.S. Cl.
CPC ............... *H03G 3/00* (2013.01); *H04R 25/353* (2013.01); *G10L 21/0205* (2013.01);
(Continued)

(58) Field of Classification Search
CPC ......... H03G 3/00; H03D 3/002; H03D 3/005; H04R 25/353; H04R 25/43; H04R 2225/43; H04R 25/356; G10L 21/0364; G10L 21/0205; H03C 5/00; H03C 3/40; H03C 1/00
USPC ............. 329/315, 318, 320; 381/37, 38, 68.2, 381/98; 455/312; 332/117, 120, 123
See application file for complete search history.

(56) References Cited

U.S. PATENT DOCUMENTS 7,225,027 B2    5/2007    Zeng et al.
2003/0044034 A1    3/2003    Zeng et al.

FOREIGN PATENT DOCUMENTS

EP          2 184 929 A1    5/2010
WO    WO 96/41498 A1    12/1996

OTHER PUBLICATIONS

Chowning, "The Synthesis of Complex Audio Spectra by Means of Frequency Modulation", Journal of the Audio Engineering Society, vol. 21, No. 7, Sep. 1973, pp. 527-534.

(Continued)

*Primary Examiner* — Richard Tan
(74) *Attorney, Agent, or Firm* — Birch, Stewart, Kolasch & Birch, LLP

(57) ABSTRACT

A method for processing an audio signal (i(t)), comprises: receiving a first set (x(t)) of time-varying signals representing a first sound comprised in the audio signal (i(t)), the first set (x(t)) of time-varying signals comprising an amplitude modulation signal (a(t)), a carrier frequency signal ($f_c(t)$), a pitch signal ($f_0(t)$) and an FM index signal (h(t)); and modifying the first set (x(t)) of time-varying signals by modifying the amplitude of the FM index signal (h(t)), thereby providing a first modified set (x'(t)) of time-varying signals. The resulting first modified set (x'(t)) of time-varying signals may subsequently be modulated to provide an audio output signal.

15 Claims, 16 Drawing Sheets

(51) Int. Cl.
 *H03C 3/40* (2006.01)
 *G10L 21/02* (2013.01)
 *G10L 21/0364* (2013.01)

(52) U.S. Cl.
 CPC .............. *G10L 21/0364* (2013.01); *H03C 1/00* (2013.01); *H03C 3/40* (2013.01); *H03C 5/00* (2013.01); *H04R 25/356* (2013.01); *H04R 25/43* (2013.01); *H04R 2225/43* (2013.01)

(56) References Cited

OTHER PUBLICATIONS

EPO—Office Action mailed on Apr. 10, 2015 issued with respect to the corresponding application No. 14199546.4.

Lazzarini V. et al., "Theory and Practice of Modified Frequency Modulation Synthesis". Journal of the Audio Engineering Society 58 (6), 2010, pp. 459-471.

Maragos P et al., "Energy Separation in Signal Modulations with Application to Speech Analysis". IEEE Transactions of Signal Processing, vol. 41, No. 10, Oct. 1993, pp. 3024-3051.

Nie K. et al., "Encoding Frequency Modulation to Improve Cochlear Implant Performance in Noise". IEEE Transaction on Biomedical Engineering 52 (1), Jan. 2005, pp. 64-73.

Potamianos A et al., "Speech Analysis and Synthesis using an AM-FM Modulation Model", Speech Communication 28 1999, pp. 195-209.

Zeng FG et al., "Speech recognition with amplitude and frequency modulations". Proceedings of the National Academy of Sciences 102 (7), Feb. 15, 2005, pp. 2293-2298.

METHODS AND APPARATUS FOR PROCESSING AUDIO SIGNALS

This application is a continuation application of co-pending application Ser. No. 13/890,001, filed on May 8, 2013, and claims the benefit of U.S. Provisional Application No. 61/644,457 filed on May 9, 2012 and to patent application Ser. No. 12/167,267.9 filed in the European Patent Office, on May 9, 2012. The entire contents of all of the above applications is hereby incorporated by reference.

TECHNICAL FIELD

The present invention relates to methods, apparatus and systems for processing audio signals.

The invention may be useful in a wide range of audio processing systems, e.g. audio broadcast systems, audio communication systems, speech recognition systems, audio reconstruction systems and public address systems, as well as in audio processing apparatus, such as hearing devices.

BACKGROUND ART

The acoustic signal reaching a listener's ear is typically a mixture of several sounds originating from different sound sources. The human auditory system utilises a large number of simultaneous and sequential cues in the received sounds to segregate them from other sounds received at the same time (Bregman 1990). The ability to combine cues in time and frequency further allows, especially normal-hearing listeners, to correctly interpret received sounds, even when they are strongly degraded, e.g. due to masking by other sounds or due to transmission via channels with poor transmission characteristics.

The Temporal Fine Structure (TFS) of a sound carries cues which in some situations may be crucial to a listener for identifying and locating the sound source, as well as for understanding the meaning of the sound (Hopkins, Moore and Stone 2008). The TFS also carries cues that allow segregation of sounds from multiple sound sources. For instance, Andersen and Kristensen have shown that normal-hearing listeners benefit—in terms of speech recognition thresholds—from both monaural and binaural TFS cues in a difficult listening situation with 3 spatially separated speakers (Andersen et al. 2010).

Recent experiments have shown that—compared to normal-hearing listeners—hearing-impaired listeners have a reduced sensitivity to TFS cues in acoustic signals (Hopkins and Moore 2007; Moore and Sek 2009) and are less able to utilise TFS cues in difficult listening situations with two simultaneous speakers (Hopkins, Moore and Stone 2008; Lunner et al. 2011). The stimuli in the TFS 1 Test (Moore and Sek 2009) were presented at positive sensation levels (i.e. above the individual hearing threshold), and the reduced sensitivity is therefore probably not caused by limited audibility of the stimuli, especially, as normal-hearing listeners' performance did not improve with increased sensation levels (Moore and Sek 2009). Furthermore, there is growing evidence that aging also contributes to limiting the access to TFS cues (Hopkins and Moore 2011; Ruggles, Bharadwaj and Shinn-Cunningham 2011).

Naturally occurring sounds are typically time-varying signals with spectral components occupying a relatively wide portion of the audible frequency range. To facilitate decoding of cues from a sound, all its spectral components should preferable be conveyed to the listener without distortion. This is, however, not always possible. It is, for instance, quite common that portions of the sound spectrum of a useful sound are masked by other sounds or noise—and/or attenuated by band-limited sound transmission channels.

A poor signal quality decreases the human auditory system's ability to correctly decode cues in the sounds. To compensate for this decrease, the listener has to employ cognitive skills and e.g. exploit redundancies in spoken words in order to understand what is said. Poor sound quality may thus obviously reduce intelligibility and lead to misunderstandings, but also stresses the listener and reduces the listener's general awareness. Many audio systems therefore comprise means for reducing or preventing noise in the processed sound as well as means for avoiding loss of spectral components during narrowband transmission. The methods that are traditionally employed to achieve such improvement of the sound quality include noise reduction, the use of directional microphones as well as the use of algorithms for bandwidth compression and decompression.

In hearing aids, the use of noise reduction and directional microphones allows increasing the signal-to-noise ratio (SNR) by attenuating audio signals that it is assumed that the listener is not interested in. The decision as to what is interesting may be based on assuming that the target (the source of the useful sound) is in front and maskers (the noise sources) are behind the listener, cf. (Boldt et al. 2008), and/or on a discrimination between speech and noise, cf. (Elberling, Ekelid and Ludvigsen 1991). In many situations that comply with these assumptions, such methods may be beneficial for hearing-impaired listeners. However, in other situations, such methods may provide limited benefits, e.g. if all sounds are speech and appear in front of the listener. Furthermore, if the listener is actually interested in dividing the attention among multiple sound sources, attenuation of some of the sources may be disadvantageous.

Frequency transposition and non-linear frequency compression (Neher and Behrens 2007) may enhance hearing-impaired listeners' access to multiple sound sources in situations that do not comply with the above mentioned assumptions. Similar benefits may be achieved by enhancing the spectral contrast with critical-band compression (Yasu et al. 2008), where the frequency contents of each critical band is compressed to decrease the width of the basilar membrane excitation and thus decrease the spectral masking effects. A common side-effect of such methods is, however, that harmonic relations between partials of the sound are broken.

Note that in the present context, the term "partials" refers to the fundamental frequency and its harmonics or overtones in a composite spectrum.

Listeners generally tend to pay more attention to loud sources than to quiet sources. A well known and very simple means for increasing the intelligibility of speech is thus to increase its loudness relative to other sounds. The same applies to other useful sounds to which it is desired to draw the attention of a listener. A simple increase in the sound pressure level of a useful sound is, however, not always practical. It may e.g. lead to increased power consumption and/or distortion in the audio systems, earlier occurrence of listener fatigue, disturbance of others, amplification of noise accompanying the useful sound, etc.

Humans are generally able to order sounds according to their loudness, which is a subjective measure of the perceived strength of the sound. When two sound sources are located equally far away, a listener will typically rate the strengths of the sound sources in the same order as the loudness of sounds received from the respective sound sources. If the distances to the sound sources differ, listeners normally non-consciously compensate for the effects of different transmission paths when rating the strengths of the sound sources. Listeners are thus typically able to correctly rate a far, loud sound source stronger than a near, weak sound source, even when the listener actually receives the sound from the weak source at a higher sound pressure level than the sound from the loud source.

The mechanisms behind the above described human ability to compensate for different distances are not completely known. John M. Chowning suggested a model called "auditory perspective" as a basis for understanding some of the mechanisms (Chowning 2000). According to Chowning, the listener's auditory system uses various cues in received sounds to place the sources of the sounds at different distances and determines loudness of the sources analogously to how the visual system functions. Chowning suggests that useful loudness or distance cues may include e.g. spectral envelope shape, timbral definition and the amount of reverberation.

Within the context of the present patent application, the above described subjective measure of the perceived strength of a sound source is termed "apparent loudness". In other words, the apparent loudness of a sound source is a subjective measure of the perceived strength of the sound source after (non-conscious) compensation for the distance between the sound source and the listener. Correspondingly, the apparent loudness of a sound equals the apparent loudness of the sound source producing the sound.

Moore's loudness model attempts to provide an objective measure of the subjectively perceived loudness. It predicts the loudness of a given sound as the sum of the loudness of each critical band, where the loudness of each critical band is computed as an energy summation of the signal content in the critical band. The model includes the level compression performed by the auditory system (Moore and Glasberg 2004). A simplified version of the model is:

$$L = \Sigma_{C=1}^{C} |\sqrt{\Sigma_{k \in K(c)} |F(A(k))|^2}|, \quad (1)$$

where L is the loudness in dB, C is the number of critical bands, K(c) the set of centre frequencies within each of the critical bands, F the compressive cochlear function, and A the magnitude of the spectrum within the respective critical band. The applicability of the model requires that the spectrum be sampled with sufficient frequency resolution relative to the critical bandwidths. Moore's loudness model does not include distance compensation and does thus not predict the apparent loudness.

In an earlier article, Chowning disclosed a method for synthesising sounds of musical instruments, wherein the sounds are generated by means of combined frequency modulation (FM) and amplitude modulation (AM) (Chowning 1973). The modulation is controlled by a set of parameters, which specify e.g. the duration of the sound, the amplitude, the carrier frequency, the modulating frequency and the frequency modulation index (FM index). Chowning found out that the vividness of some synthesised instrument sounds, particularly of synthesised brass instrument sounds, could be substantially improved by varying the FM index over time. The proposed variations are relatively simple, e.g. linear, exponential and hyperbolic shifts, and are obtained by generating an FM index signal in a generator controlled by a few parameters in the parameter set. Varying the FM index over time has a substantial impact on the time variation of the synthesised sound spectra, and Chowning hypothesises that the general character of the evolution of the frequency components over time is more important for the subjective impression of the synthesised sounds than the amplitude curve for each frequency component. Chowning further discloses multiple parameter sets, which may be used to achieve realistic synthesis of several different types of musical instruments. Starting and/or ending points for the time-varied modulation indices are typically about unity or larger. Later, Chowning improved the synthesis of voiced sounds using the same method but different modulation signals (Chowning 1980).

Lazzarini and Timoney disclosed a variant of the above mentioned FM synthesis, called modified frequency modulation (ModFM) (Lazzarini and Timoney 2010). ModFM is based on a modified version of the classic FM formula and produces frequency-modulated signals wherein the distribution of spectral components varies with a more predictable dependence on the frequency modulation index than in the classic FM. This allows ModFM to provide a more naturally-sounding synthesis of musical instruments.

As Chowning also pointed out, the principles of FM and the influence of the FM index on the spectral content of the modulated signals are well known from the field of radio signal transmission. In this field, frequency modulation with modulation indices above unity is generally known as "wideband frequency modulation".

The simplest form of oral communication involves a speaking person (the speaker) and a listening person (the listener). The speaker transforms a message into speech, i.e. sound, and transmits the speech into the air. In the air, the speech is normally mixed with other sounds before it reaches the listener's ears. In order to understand the message, the listener thus has to derive or decode it from the mixture of sounds. Errors in the decoding process may obviously lead to misinterpretation of the message.

The physical generation of speech is a complex process, which among others involves the larynx with the vocal cords and the vocal tract of the speaker. Current state of art suggests that slow, correlated FM and AM are produced in natural speech (Teager 1980; Teager and Teager 1990; Bovik, Maragos and Quatieri 1993; Maragos, Kaiser and Quatieri 1993 A; Maragos, Kaiser and Quatieri 1993 B; Zhou, Hansen and Kaiser 2001), and that the FM cues are important for allowing normal-hearing listeners to decode speech in situations with negative SNR, whereas FM extraction may be impaired among people with cochlear impairment (Moore and Skrodzka 2002; Heinz et al. 2010). Hearing-impaired listeners can, however, utilise the AM cues (Hopkins, Moore and Stone 2008).

In situations with competing sounds, speakers tend to modify their voice to increase the clarity of their voice. This is usually referred to as vocal effort, Clear speech (Lindblom 1996) or Lombard effect after Etienne Lombard who discovered the effect in 1909. Lindblom reports that in short-duration vowels, the centre frequency of the second formant deviates from its target value (Lindblom 1996). Folk reports that the average and the dynamic range of the fundamental frequency ($f_0$) increases with rising noise level, as do the average intensity and the dynamic range of the intensity, while the speaking rate decreases (Folk and Schiel 2011). For many natural sounds, increased intensity is also accompanied by increased bandwidth (Chowning 2000). This dependency of the speaker's voice on the noise level presents a major challenge for Automatic Speech Recognition (ASR). For instance, ASR systems cannot be reliably tested simply by feeding them with sounds mixed from clean-speech libraries and noise libraries (Winkler 2011).

Potamianos and Maragos disclosed methods for speech analysis and synthesis, wherein speech is modelled by a sum of AM-FM modulated signals, each signal representing a speech formant (Potamianos and Maragos 1999).

It is further known from hearing aids of the cochlear-implant (CI) type that the audio signal is made available to the hearing-aid user by extracting FM information and presenting this information in an FM modulated carrier signal with a relatively narrow bandwidth (Nie, Stickney and Zeng 2005; Zeng et al. 2005; Zeng and Nie 2007).

DISCLOSURE OF INVENTION

It is an object of the present invention to provide methods for processing an audio signal without the above mentioned disadvantages.

It is a further object of the present invention to provide apparatus and systems for processing an audio signal without the above mentioned disadvantages.

These and other objects of the invention are achieved by the invention defined in the independent claims and as explained in the following description. Further objects of the invention are achieved by the embodiments defined in the dependent claims and in the detailed description of the invention.

The invention is based on some surprising discoveries made by the inventors, namely:
that the human vocal system generates speech with fast FM modulations (typically in addition to slow and possibly correlated FM and AM modulations), wherein the FM index of the fast FM modulations is varied in correlation with the vocal effort, i.e. in correlation with how robust and clear the speaker would like the message to be transmitted;
that the FM index, and thus the vocal effort, correlates with the apparent loudness of the speech;
that the apparent loudness of a wide range of naturally occurring sounds may be altered by changing the FM index of fast FM modulations of the sounds; and
that the human auditory system seems to decode cues for apparent loudness and vocal effort directly from the FM index of fast FM modulations of the sounds.

In other words, varying the FM index of fast FM modulations of a sound affects the spectral content of the sound in a way that a listener directly interprets as varying the apparent loudness of the sound, and as varying the vocal effort in the case that the sound is speech.

Furthermore, increasing the FM index increases the number of significant sidebands in the fast FM modulation and thus causes a spread of the signal information over a wider frequency range, however without increasing the intensity of the sound.

In the present context, "fast FM modulation" refers to FM modulation with modulation rates above 60 Hz. Fast FM modulation rates encountered in naturally occurring sounds, such as speech, typically lie within the frequency range between 60 Hz and several kHz.

These new discoveries allow construing various novel audio signal processing methods, apparatus and systems, which do not suffer from the above mentioned disadvantages and further provide other significant advantages over the prior art. Such methods, apparatus and systems may be beneficial to hearing-impaired listeners and/or to normal-hearing listeners.

The audio signals operated upon in such methods, apparatus and systems may generally be represented by a set of time-varying signals comprising an amplitude modulation signal, a carrier frequency signal, a pitch signal and a frequency modulation index signal (or short: "FM index signal"). In the following, such a set is denoted an "extended FM representation" or short: "XFMR". In an XFMR comprising a sound, the amplitude modulation signal generally represents the envelope of the sound, and the pitch signal generally represents the fundamental frequency and/or the pitch of the sound.

Correspondingly, the terms "XFM demodulation" and "XFM analysis", or short: "XFMR", refer to the process of determining an XFMR of an audio signal from a single waveform representation of the audio signal, and the terms "XFM modulation" and "XFM synthesis", or short: "XFMS", refer to generating or synthesising a single waveform representation of an audio signal from an XFMR of the audio signal. Furthermore, the term "XFMR signal" refers to any of the four time-varying signals in the XFMR.

It should further be noted that the carrier frequency signal, the pitch signal and the FM index signal together represent the TFS of the audio signal.

In the present context, the term "audio signal" refers to any processable representation of sound, e.g. an analog electric signal or a digital signal. Note that an XFMR is thus also an audio signal.

Furthermore, a "hearing device" refers to a device, such as e.g. a hearing aid or an active ear-protection device, which is adapted to improve or augment the hearing capability of an individual by receiving acoustic signals from the individual's surroundings, generating corresponding audio signals, modifying the audio signals and providing the modified audio signals as audible signals to at least one of the individual's ears. Such audible signals may e.g. be provided in the form of acoustic signals radiated into the individual's outer ears, acoustic signals transferred as mechanical vibrations to the individual's inner ears through the bone structure of the individual's head and/or electric signals transferred directly or indirectly to the cochlear nerve of the individual. The hearing device may be configured to be worn in any known way, e.g. as a unit arranged behind the ear with a tube leading radiated acoustic signals into the ear canal or with a loudspeaker arranged close to or in the ear canal, as a unit entirely or partly arranged in the pinna and/or in the ear canal, as a unit attached to a fixture implanted into the skull bone, etc. More generally, a hearing device comprises an input transducer for receiving an acoustic signal from an individual's surroundings and providing a corresponding input audio signal, a signal processing circuit for processing the input audio signal and an output transducer for providing an audible signal to the individual in dependence on the processed audio signal.

A "hearing system" refers to a system comprising one or two hearing devices, and a "binaural hearing system" refers to a system comprising one or two hearing devices and being adapted to provide audible signals to both of the individual's ears with some degree of correlation and/or cooperation. Hearing systems or binaural hearing systems may further comprise "auxiliary devices", which communicate with the hearing devices and affect and/or benefit from the function of the hearing devices. Auxiliary devices may be e.g. remote controls, audio gateway devices, mobile phones, public-address systems, car audio systems or music players. Hearing devices, hearing systems or binaural hearing systems may e.g. be used for compensating for a hearing-impaired person's loss of hearing capability, augmenting a normal-hearing person's hearing capability and/or protecting a person's hearing system.

As used herein, the singular forms "a", "an", and "the" are intended to include the plural forms as well (i.e. to have the meaning "at least one"), unless expressly stated otherwise. It will be further understood that the terms "has", "includes", "comprises", "having", "including" and/or "comprising", when used in this specification, specify the presence of stated features, integers, steps, operations, elements and/or components, but do not preclude the presence or addition of one or more other features, integers, steps, operations, elements, components and/or groups thereof. It will be understood that when an element is referred to as being "connected" or "coupled" to another element, it can be directly connected or coupled to the other element, or intervening elements may be present, unless expressly stated otherwise. As used herein, the term "and/or" includes any and all combinations of one or more of the associated listed items. The steps of any method disclosed herein do not have to be performed in the exact order disclosed, unless expressly stated otherwise.

BRIEF DESCRIPTION OF THE DRAWINGS

The invention will be explained in more detail below in connection with preferred embodiments and with reference to the drawings in which.

The figures are schematic and simplified for clarity, and they just show details, which are essential to the understanding of the invention, while other details are left out. Throughout, like reference numerals and/or names are used for identical or corresponding parts.

Further scope of applicability of the present invention will become apparent from the detailed description given hereinafter. However, it should be understood that the detailed description and specific examples, while indicating preferred embodiments of the invention, are given by way of illustration only, since various changes and modifications within the scope of the invention will become apparent to those skilled in the art from this detailed description.

MODE(S) FOR CARRYING OUT THE INVENTION

Figure 1A:
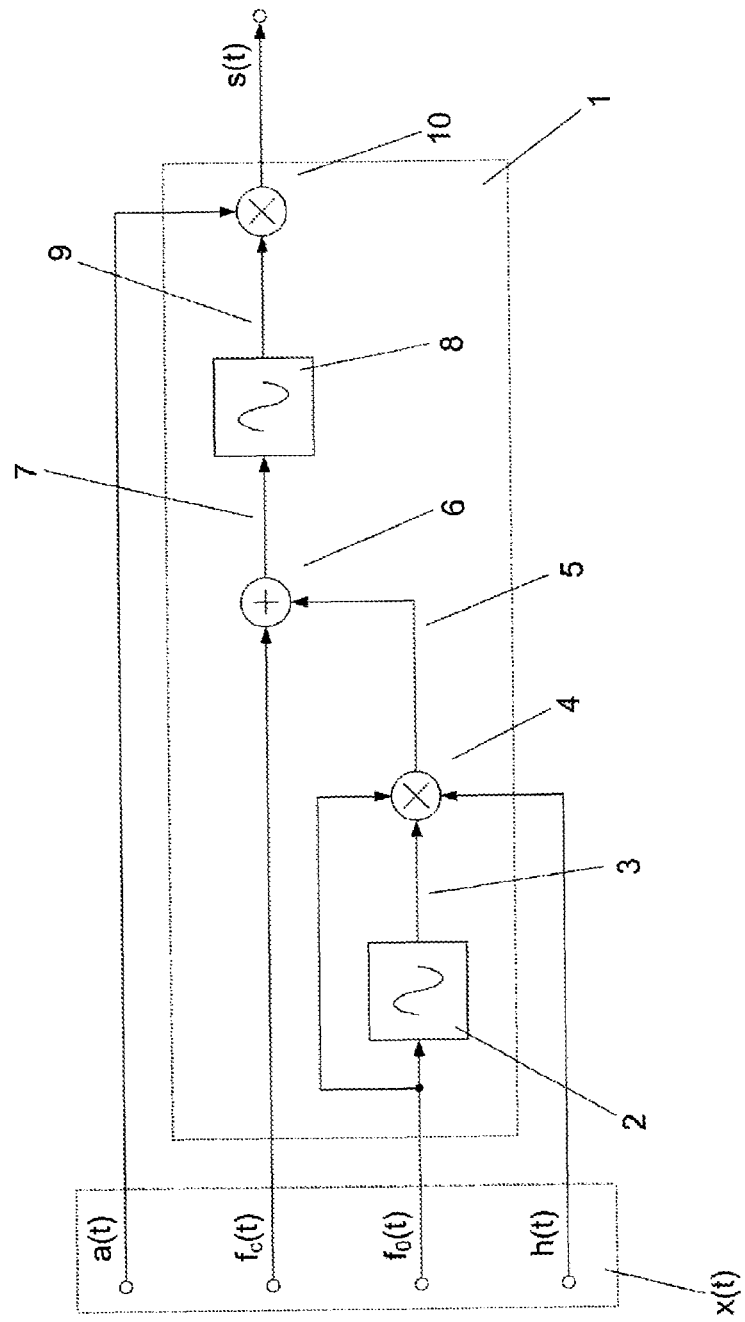
FIG. 1A.

FIG. 1A shows in a functional block diagram a basic FM modulator 1 known in the prior art, e.g. from Chowning 1973. The basic FM modulator 1 takes as input an XFMR x(t) of the audio signal to be synthesised and provides a frequency- and amplitude modulated waveform audio signal s(t) as output. The XFMR x(t) comprises an amplitude modulation signal a(t), a carrier frequency signal $f_c(t)$, a pitch signal $f_0(t)$ and an FM index signal h(t). The pitch signal $f_0(t)$ controls an oscillator 2, which provides an output signal 3 with constant amplitude and a frequency corresponding to the pitch signal $f_0(t)$. The output signal 3 of the oscillator 2 is multiplied with the pitch signal $f_0(t)$ and the FM index signal h(t) in a multiplier 4, which provides the resulting product in a frequency modulation signal 5. The frequency modulation signal 5 is added to the carrier frequency signal $f_c(t)$ in an adder 6, which provides the resulting sum in a frequency signal 7. The frequency signal 7 controls an oscillator 8, which provides an output signal 9 with constant amplitude and a frequency corresponding to the frequency signal 7. The output signal 9 of the oscillator 8 is multiplied with the amplitude modulation signal a(t) in a multiplier 10, which provides the resulting product in the modulated audio signal s(t).

Figure 1B:
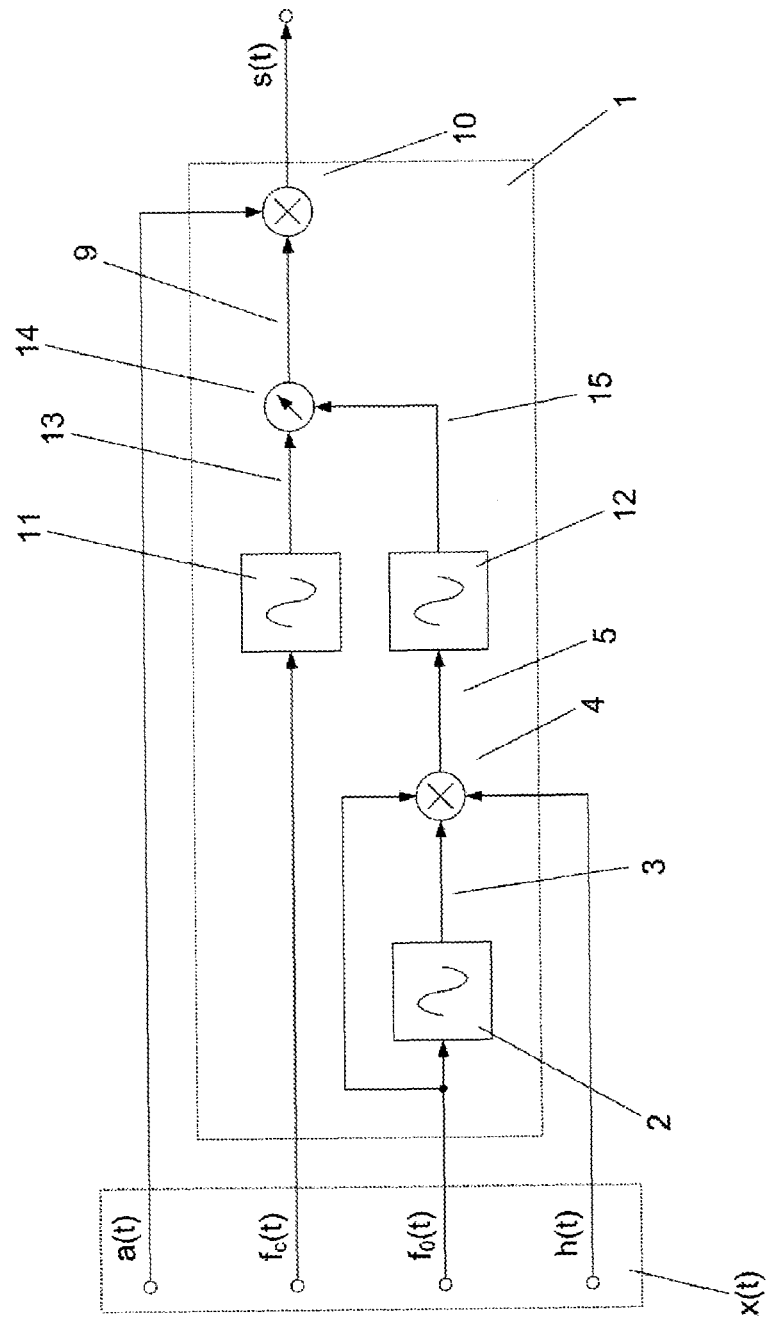
FIG. 1B show examples of known, basic FM modulators.

In an alternative, known implementation of the basic FM modulator 1 shown in FIG. 1B, each of the carrier frequency signal $f_c(t)$ and the frequency modulation signal 5 control respective oscillators 11, 12, and the output 13 of the oscillator 11 controlled by the carrier frequency signal $f_c(t)$ is frequency-shifted in a frequency shifter 14 by an amount equal to the output 15 of the oscillator 12 controlled by the frequency modulation signal 5. The frequency-shifted signal 9 corresponds closely to the output signal 9 of the oscillator 8 in FIG. 1A.

In both implementations, the amplitude modulation signal a(t) controls the time-varying amplitude of the modulated audio signal s(t). The carrier frequency signal $f_c(t)$ controls the time-varying centre frequency of the modulated audio signal s(t), the pitch signal $f_0(t)$ controls the time-varying spectral distance between sidebands in the frequency modulation of the modulated audio signal s(t) and the FM index signal h(t) controls the time-varying spectral distribution of the energy in the modulated audio signal s(t).

Figure 2:
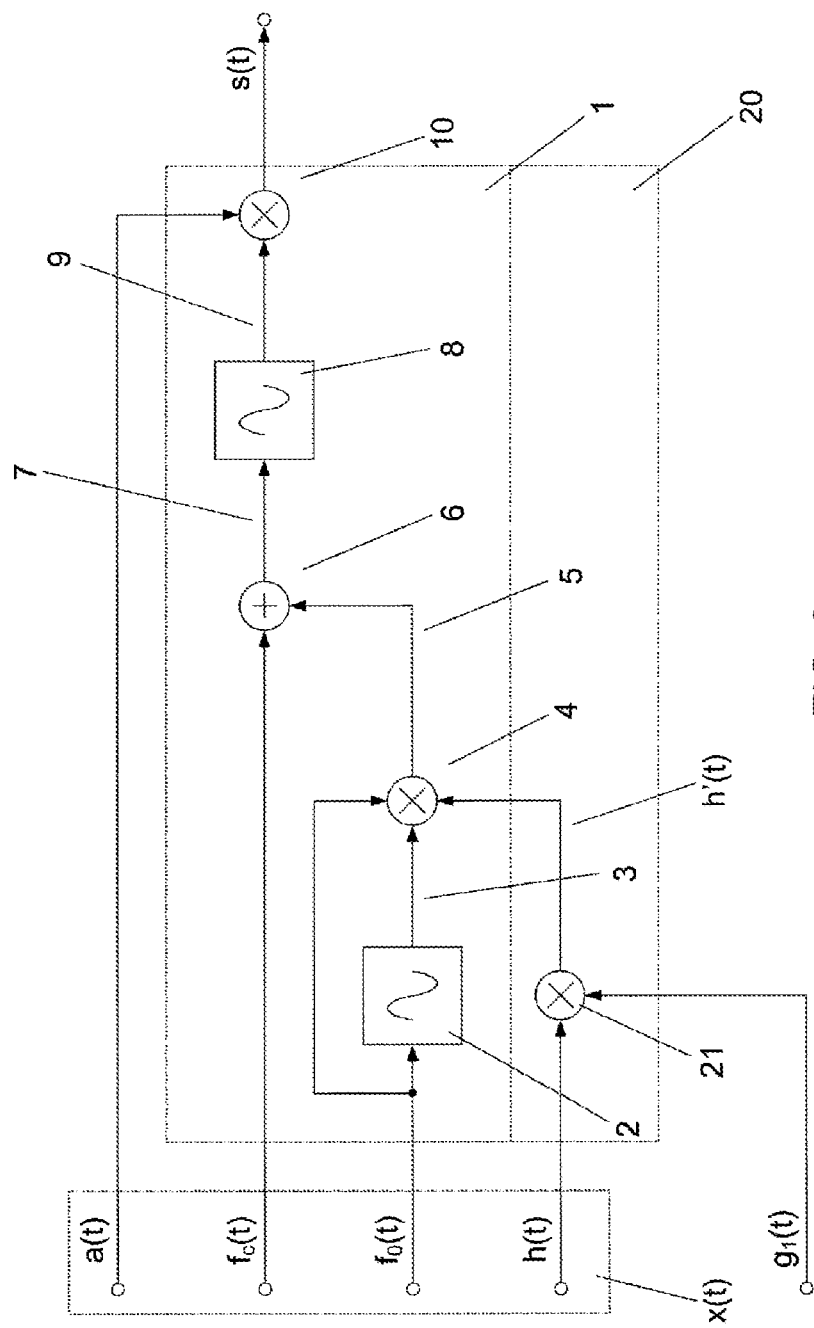
FIG. 2 shows an extended FM modulator according to a first embodiment of the invention.

FIG. 2 shows in a functional block diagram an extended FM modulator 20 (XFM modulator) according to a first embodiment of the present invention. In addition to the functional blocks of the basic FM modulator 1 of FIG. 1A, the XFM modulator 20 comprises a multiplier 21, which multiplies the FM index signal h(t) of the received XFMR x(t) with a first gain signal $g_1(t)$ and provides the resulting product in a modified FM index signal h'(t) that is fed to the multiplier 4. The amplitude of the FM index signal h(t) may thus be modified, i.e. amplified or attenuated, by setting the first gain signal $g_1(t)$ to a value different from unity. Since the modified FM index signal h'(t) controls the spectral distribution of the energy in the modulated audio signal s(t), the first gain signal $g_1(t)$ may be used to alter this spectral distribution.

The input received by the XFM modulator 20 is preferably an XFMR x(t) that has been demodulated from an input waveform audio signal i(t) (see FIGS. 6-9). Accordingly, the XFM modulator 20 may be used to provide a modulated audio signal s(t) corresponding to the input audio signal i(t), however with a different spectral distribution of the signal energy.

An immediate effect of amplifying the FM index signal h(t) is that the signal power of the modulated audio signal s(t) is spread over a larger frequency range, however without changing the total signal power and without changing the amount of information carried in the signal. Another effect is that the information redundancy between different frequency ranges is increased, and the modulated audio signal s(t) is thus more robust against subsequent addition of band-limited noise or band-limited signal attenuation. The increase in information redundancy primarily concerns the TFS and the cues carried by the TFS. A further effect is that the apparent loudness of the modulated audio signal s(t) increases. Both normal-hearing and hearing-impaired listeners may benefit from these effects. If, in a subsequent audio signal processing, the modulated audio signal s(t) is mixed with band-limited noise or portions of its spectrum are attenuated, the increased frequency spread of the signal power will typically increase the ability of listeners from both groups to decode the TFS cues from the processed signal. Listeners with a band-limited hearing impairment may obviously also benefit from the increased frequency spread, if the impaired frequency band overlaps with the frequency band of the original input audio signal i(t). The increased apparent loudness also makes it easier for a listener to focus his/her attention on the sound and/or its source.

A goal commonly pursued in traditional solutions for improving sound quality in audio processing methods and systems is an increase of the SNR in those frequency regions where important cues are expected to occur. This is also the case in hearing aids, wherein typically one or more frequency bands are amplified to increase audibility of sounds over competing noise. However, amplifying the FM index signal h(t) of an input audio signal i(t) typically works reversely. If the spectral power density of a competing broadband noise signal is maintained, amplification of the FM index signal h(t) typically reduces the SNR within the frequency bands containing the fundamental frequencies of the input audio signal i(t).

It is thus quite unexpected that amplifying the FM index signal h(t) allows increasing intelligibility of speech. The method generally allows increasing accessibility to cues conveyed by the TFS and increasing audibility of sounds, as well as compensating for a wide range of hearing impairments.

Conversely, an immediate effect of attenuating the FM index signal h(t) is that the signal power of the modulated audio signal s(t) is concentrated within a smaller frequency range, again without changing the total signal power and without changing the amount of information carried in the signal. The SNR within this smaller frequency range typically increases. Due to the smaller bandwidth, the modulated audio signal s(t) may be processed by methods or apparatus having less bandwidth than the original input audio signal i(t). The processed signal may subsequently be subjected to an amplification of the FM index signal h(t) in order to restore the wider bandwidth. Furthermore, the apparent loudness of the audio signal decreases, which typically causes a listener to pay less attention to the audio signal and thus to find it less pronounced or disturbing. For some hearing-impaired listeners, however, the smaller bandwidth of the modulated audio signal s(t) may at least partly compensate for a reduced frequency selectivity in the auditory system and thus aid them in decoding the TFS.

The estimation of whether and/or in which situations individual listeners would benefit from amplification or attenuation of the FM index signal h(t) may be made e.g. on the basis of appropriate clinical tests.

The basic FM modulator 1 comprised in the XFM modulator 20 may alternatively be implemented as shown in FIG. 1B or as any other suitable FM modulator known in the art. The ModFM modulator (Lazzarini and Timoney 2010) is an example of such a suitable FM modulator.

Figure 3:
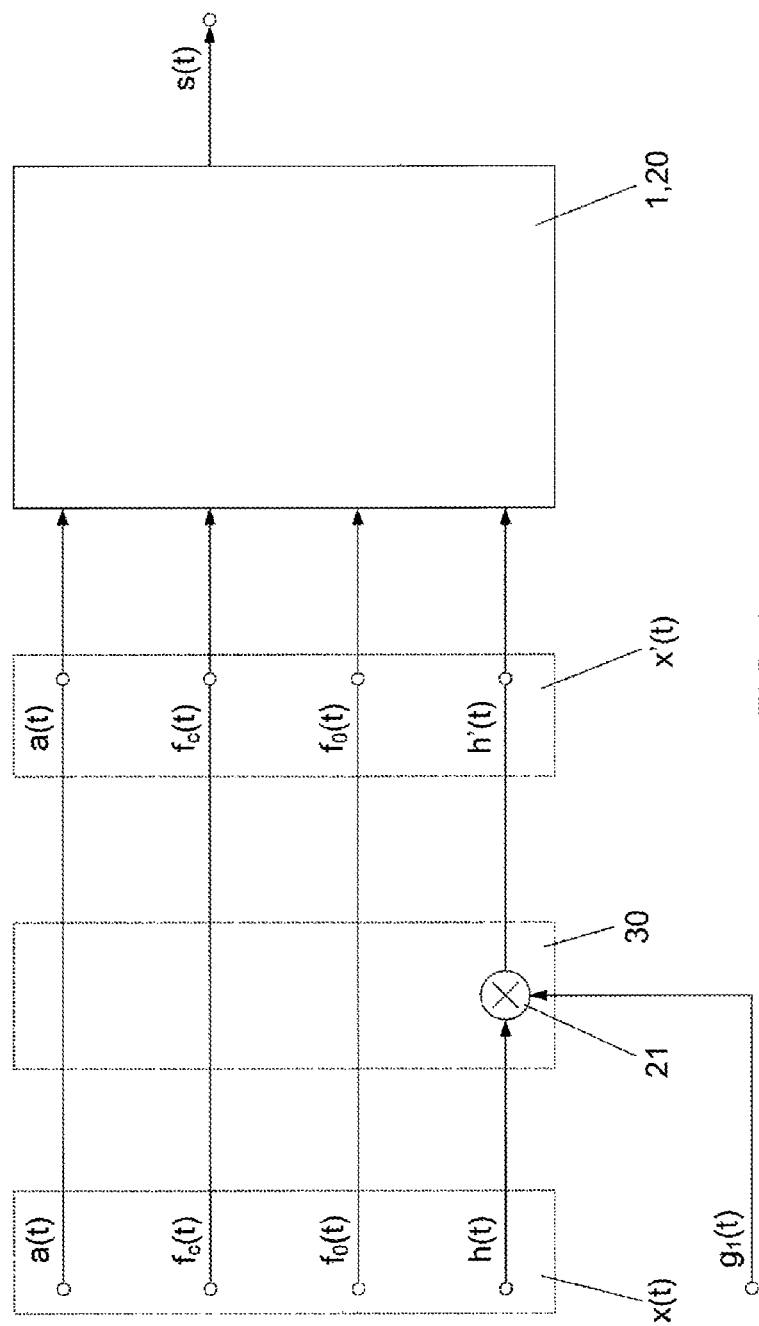
FIG. 3 shows an XFMR modifier according to a second embodiment of the invention.

FIG. 3 shows in a functional block diagram an XFMR modifier 30 according to a second embodiment of the invention. The XFMR modifier 30 receives an XFMR x(t) and provides a modified XFMR x'(t) with an amplitude modulation signal a(t), a carrier frequency signal $f_c(t)$, a pitch signal $f_0(t)$ and a modified FM index signal h'(t). The first three mentioned XFM signals a(t), $f_c(t)$, $f_0(t)$ in the modified XFMR x'(t) are equal to the corresponding XFM signals in the received XFMR x(t), whereas the modified FM index signal h'(t) equals the product of the FM index signal h(t) of the received XFMR x(t) and a first gain signal $g_1(t)$. Similarly to the XFM modulator 20 in FIG. 2, the XFMR modifier 30 comprises a multiplier 21, which multiplies the FM index signal h(t) with the first gain signal $g_1(t)$ and thus provides the modified FM index signal h'(t).

The modified XFMR x'(t) may be provided to a basic FM modulator 1 or an XFM modulator 20 for provision of a modulated audio signal s(t). Thus, the modification of the amplitude of the FM index signal h(t) and the generation of the modified XFMR x'(t) may take place in a first apparatus, whereafter the modified XFMR x'(t) is transmitted to a second apparatus by means of appropriate transmission means, such as wired or wireless transmission circuits, such as e.g. optical or radio-frequency transmitter and receiver circuits (not shown). In the second apparatus, an (X)FM modulator 1, 20 (i.e. a basic FM modulator 1 or an XFM modulator 20) may then provide the modulated audio signal s(t) from the received modified XFMR x'(t).

Additionally, or alternatively, the modification of the amplitude of the FM index signal h(t) and the generation of the modified XFMR x'(t) may take place at a first moment in time, whereafter the modified XFMR x'(t) is stored for a period of time, e.g. in the first or the second or in a third, intermediate apparatus, by means of appropriate storage means, such as e.g. optical, electronic or magnetic storage means (not shown). At a second moment in time, the modified XFMR x'(t) may be retrieved from the storage means and provided to an (X)FM modulator 1, 20 for provision of the modulated audio signal s(t) from the retrieved modified XFMR x'(t).

Additionally, or alternatively, the input XFMR x(t) may in similar fashion have been retrieved from a temporary storage and/or received from another apparatus prior to the modification of the amplitude of the FM index signal h(t) and the generation of the modified XFMR x'(t).

Any number of XFMR modifiers 30, transmission means and/or storage means may be cascaded and in any order depending on the particular application of the invention. Executing the modification of the amplitude of the FM index signal h(t) and the provision of the modulated audio signal s(t) in different apparatus and/or locations and/or at different moments in time may obviously be of benefit in many kinds of audio processing methods and apparatus. Furthermore, transmitting and/or storing the XFMR x(t) and/or the modified XFMR x'(t) typically requires less transmission bandwidth or storage capacity than transmitting and/or storing the input audio signal i(t), depending on how many spectral components of the input audio signal i(t) the XFMR x(t) and/or the modified XFMR x'(t) represents.

Figure 4:
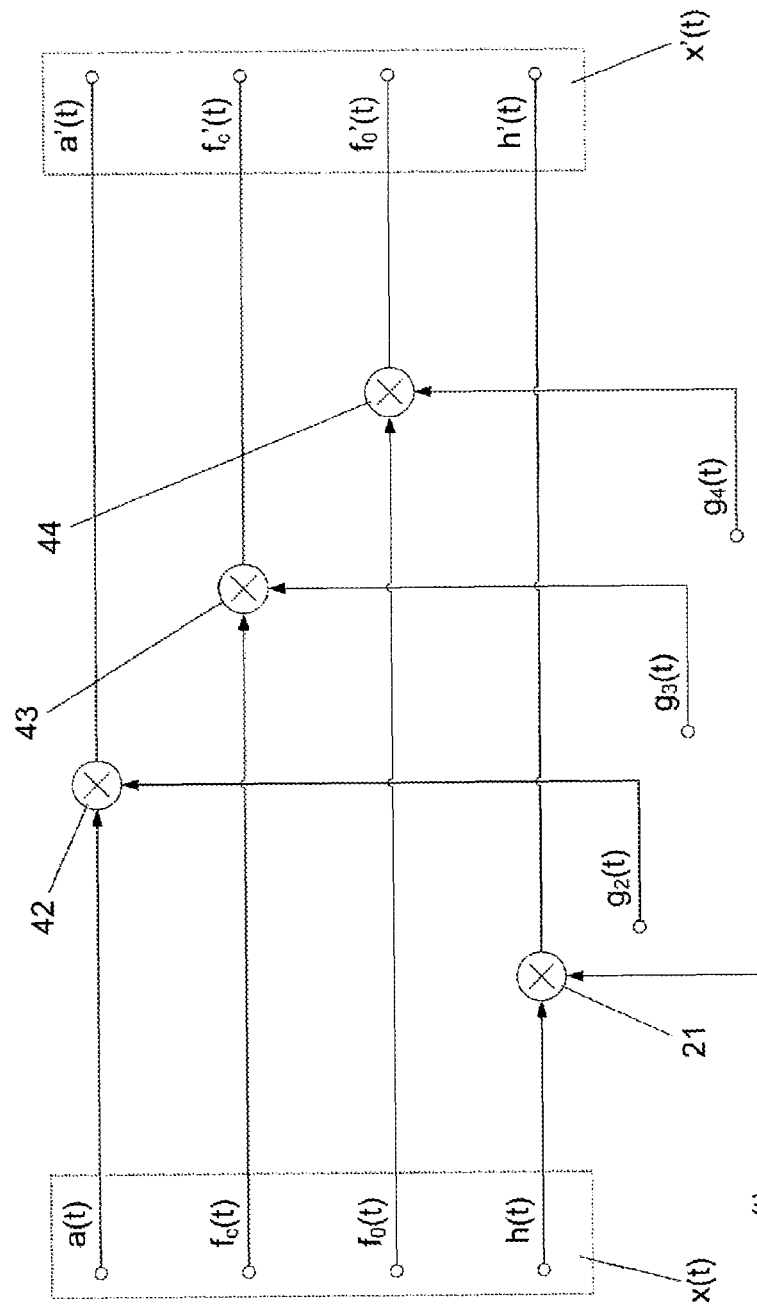
FIG. 4.

As shown in FIG. 4, further multipliers 42, 43, 44 may be used to multiply the XFM signals a(t), $f_c(t)$, $f_0(t)$ with respective gain signals $g_2(t)$, $g_3(t)$, $g_4(t)$ before FM modulation, transmission and/or storage as shown in FIGS. 2 and 3. In addition to the multiplier 21, an XFM modulator 20 or an XFMR modifier 30 may thus comprise a multiplier 42, a multiplier 43, a multiplier 44, multipliers 42 and 43, multipliers 42 and 44, multipliers 43 and 44 or all of multipliers 42, 43 and 44.

Furthermore, any such multiplier 42, 43, 44 or any combination hereof may in a similar way be comprised in a basic FM modulator 1 or in a circuit for modifying an XFMR x(t), however without the multiplier 21, e.g. for use in an audio processing system comprising an XFM modulator 20 or an XFMR modifier 30.

Amplification and attenuation of the amplitude modulation signal a(t), e.g. by means of multiplier 42, corresponds to respectively amplifying and attenuating the sound. This may thus be used as an alternative to amplifying and/or attenuating the sound in other parts of the signal chain.

Amplification and attenuation of the carrier frequency signal $f_c(t)$, e.g. by means of multiplier 43, corresponds to transposing the sound, respectively upwards and downwards in frequency. This may be used to move the sound to a frequency range that is e.g. better to perceive for a hearing impaired listener, less prone to disturbances, less attenuated in transmission and/or free of overlap with frequency ranges occupied by other useful sounds.

Amplification and attenuation of the pitch signal $f_0(t)$, e.g. by means of multiplier 44, corresponds to respectively amplifying and attenuating frequency variations of the pitch of the sound. This allows for controlling e.g. vibrato and intonation levels in speech, which may be helpful for aiding hearing impaired listeners in perceiving and decoding speech correctly.

Amplifying the pitch signal $f_0(t)$ by an integer value $G_4$ of 2 or more causes a corresponding increase in the distance between the partials of the sound, however without breaking harmonic relationships within the sound. The increased distance between partials may allow those hearing-impaired listeners, who suffer from wider auditory bandwidths than normal-hearing listeners, to resolve more components and thus to better decode speech and other sounds. In order to preserve the bandwidth of the resulting sound, the FM index signal h(t) may be attenuated by a value $G_1$, e.g. by setting the first gain signal $g_1(t)$ equal to $G_1$. The required attenuation $G_1$ may be computed from Carson's rule:

$$BW = 2(\Delta f + f_m), \quad (2)$$

wherein BW is the bandwidth, $\Delta f$ is the peak frequency deviation and $f_m$ is the highest frequency in the modulating signal. In the present context, the equation (2) may be rewritten to obtain the bandwidth BW of the XFMR x(t):

$$BW = 2(M \cdot F + F) = 2(M+1)F, \quad (3)$$

wherein M is the maximum value of the FM index signal h(t) and F is the maximum value of the pitch signal $f_0(t)$. Correspondingly, the bandwidth BW' of the modified XFMR x'(t) is:

$$BW' = 2(G_1 M + 1)G_4 F. \quad (4)$$

Setting the bandwidth BW' of the modified XFMR x'(t) equal to the bandwidth BW of the XFMR x(t) yields:

$$2(G_1 M + 1)G_4 F = 2(M+1)F. \quad (5)$$

Solving the equation (5) for $G_1$ yields:

$$G_1 = ((M+1)/G_4 - 1)/M. \quad (6)$$

Amplification and attenuation of the carrier frequency signal $f_c(t)$ and/or of the pitch signal $f_0(t)$ does not change the harmonic relations between the frequency components of the individual sounds and may thus lead to less artefacts in the modified audio signals than prior art methods.

Figure 5:
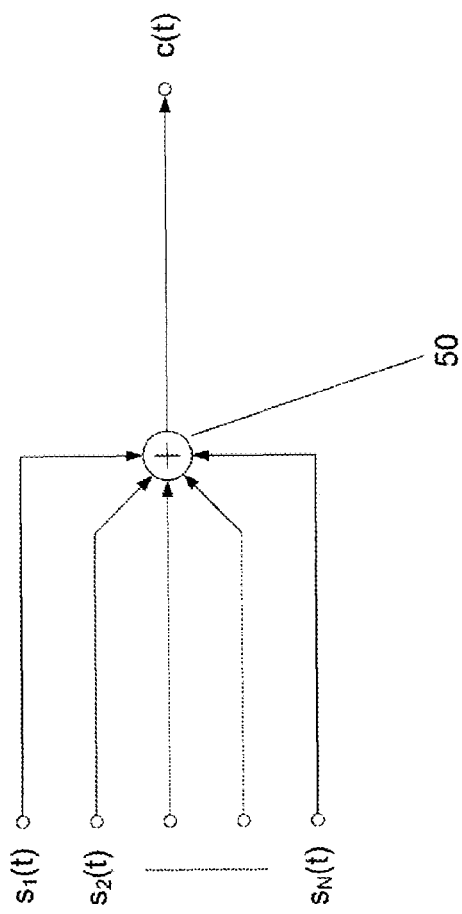
FIG. 5 show details of further embodiments of the invention.

As shown in FIG. 5, multiple audio signal $s_1(t), s_2(t) \ldots s_N(t)$ may be combined in an adder 50 to provide a composite audio signal c(t), which represents sounds from more than one sound source and/or multiple sounds from one sound source. Each of such audio signals $s_1(t), s_2(t) \ldots s_N(t)$ may be e.g. a modulated audio signal s(t) from a basic FM modulator 1, a modulated audio signal s(t) from an XFM modulator 20 or any other kind of audio signal. The amplitude of the FM index signal h(t) of at least one of the audio signal $s_1(t), s_2(t) \ldots s_N(t)$ is modified as described above prior to adding the signals. This allows e.g. for emphasising or deemphasising sounds from individual sound sources relative to sounds from other sound sources in the composite audio signal c(t) and/or for emphasising or deemphasising multiple sounds from a single sound source relative to each other. If the amplitudes of the FM index signals h(t) of multiple of the audio signal $s_1(t), s_2(t) \ldots s_N(t)$ are modified as described above, such modification may be made individually, which allows an even larger degree of freedom in "designing" the resulting sound picture.

Critical-band compression may be achieved by providing an XFMR x(t) for each of two or more sounds originating from one or more sound sources and being comprised in the input audio signal i(t), attenuating the FM index signal h(t) for one or more of the XFMR x(t), providing corresponding modulated audio signals s(t) from the modified XFMR x'(t) and combining the modulated audio signals s(t) into the composite audio signal c(t). Attenuating the FM index signals h(t) reduces the bandwidth used by each sound and/or sound source without ruining the harmonic relations between the resulting partials within each sound. This method of critical-band compression thus has fewer side effects than prior art solutions. Although their interest was not in critical-band compression and critical-band compression was not directly tested, recent experiments by Oxenham et al (Micheyl, Keebler and Oxenham 2010) indicate that hearing impaired listeners may benefit from the above disclosed critical-band compression.

In the case that some or all of the modulated audio signals s(t) have identical amplitude modulation signals a(t), the frequency-modulated portion of such signals may alternatively be added together, or otherwise combined, in an adder (not shown) in the signal path between the oscillator 8 and the multiplier 10 in FIG. 2, such that the XFM modulators 20 for such signals share the multiplier 10 for multiplication with a common amplitude modulation signal a(t). The resulting modulated audio signal may subsequently be added to other modulated audio signals s(t) in the adder 50 of FIG. 2.

Figure 6:
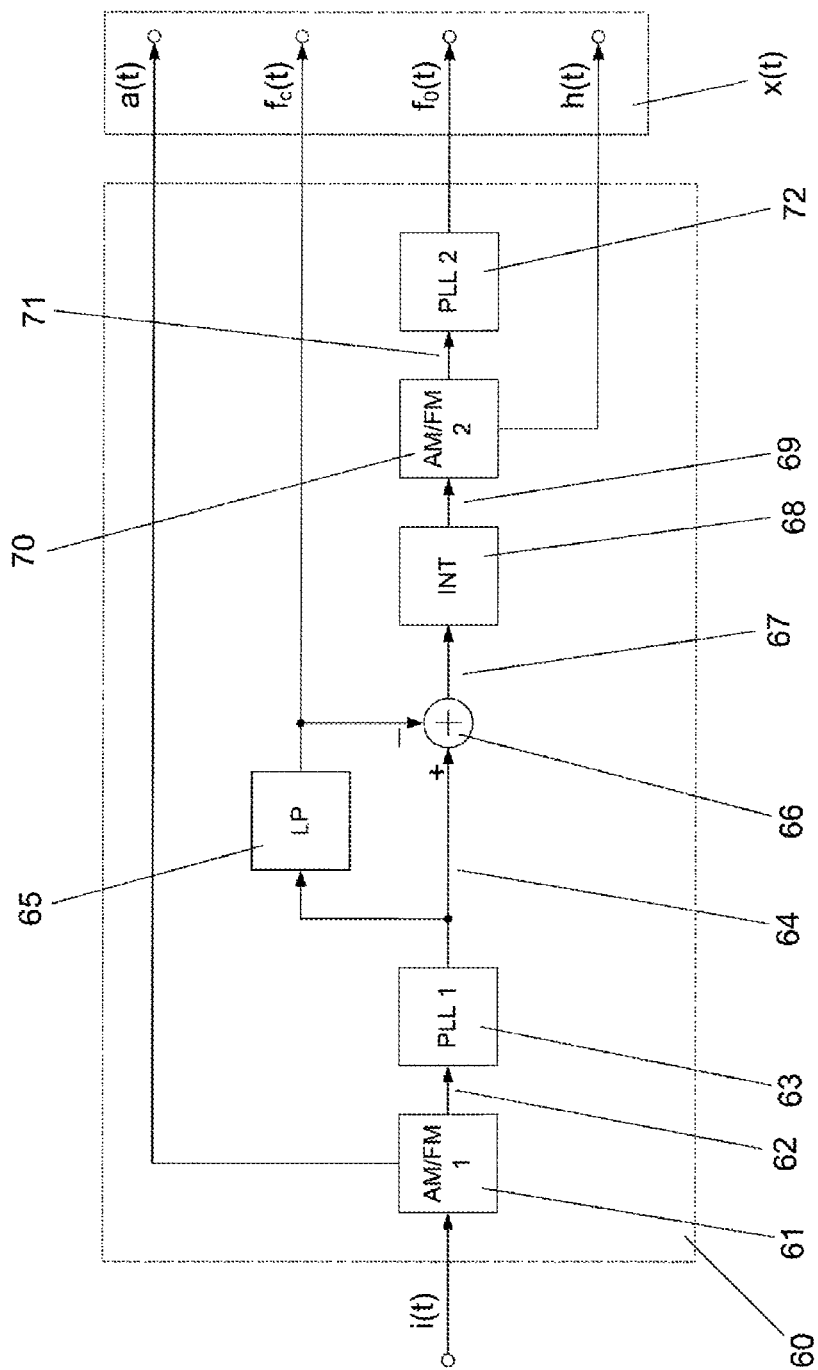
FIG. 6 shows a first embodiment of an FM demodulator comprised in further embodiments of the invention.

FIG. 6 shows in a functional block diagram an XFM demodulator 60, which may be comprised in further embodiments of the invention. The XFM demodulator 60 takes an input waveform audio signal i(t) as input and provides an XFMR x(t) of the input audio signal i(t) as output. The input audio signal i(t) may e.g. be in the form of an analog electric signal or a sampled digital signal.

A first AM demodulator 61 receives the input audio signal i(t) and decomposes it into the amplitude modulation signal a(t), which represents the instantaneous amplitude of the input audio signal i(t), and a first phase signal 62, which represents the instantaneous phase of the input audio signal i(t).

The first phase signal 62 is provided as input to a first phase-locked loop (PLL) 63, which has a time constant low enough to allow it to follow the fastest expected frequency variations in the input audio signal i(t). For speech, such frequency variations typically lie within the range up to about 10 or 20 times the pitch. The first PLL 63 functions in known fashion and provides a frequency signal 64, which represents the instantaneous frequency of the first phase signal 62 and thus of the input audio signal i(t). A low-pass filter 65 receives the frequency signal 64 and determines the carrier frequency signal $f_c(t)$ by applying a steep low-pass filtering, e.g. 12 dB/octave or 24 dB/octave, with a relatively low cut-off frequency, e.g. about 10 Hz, about 20 Hz or about 50 Hz, to the frequency signal 64. A subtractor 66 determines a frequency modulation signal 67 as the difference between the frequency signal 64 and the carrier frequency signal $f_c(t)$. An integrator 68 integrates the frequency modulation signal 67 into a normalised frequency modulation signal 69. The integration performed by the integrator 68 corresponds to the inverse of the multiplication of the modified FM index signal h'(t) with the pitch signal $f_0(t)$ in the multiplier 4 in FIG. 2.

A second AM demodulator 70 decomposes the normalised frequency modulation signal 69 into the FM index signal h(t) representing the AM part of the normalised frequency modulation signal 69 and a second phase signal 71 representing the FM part of the normalised frequency modulation signal 69. The second phase signal 71 is provided as input to a second PLL 72, which has a time constant adapted to allow it to follow the fastest expected frequency variations in the normalised frequency modulation signal 69, such as e.g. pitch variations. For speech, pitch variations typically lie within the range up to about 500 Hz or about 1000 Hz. The second PLL 72 functions in known fashion and provides the pitch signal $f_0(t)$, which represents the instantaneous frequency of the second phase signal 71. The only function of the second PLL 72 is to convert the second phase signal 71 into a frequency signal. Thus, it may be omitted, e.g. if the XFMR x(t) is to be stored for later processing and/or is to be transmitted to another apparatus for processing there. In this case the pitch signal $f_0(t)$ of the XFMR x(t) is in the form of a time-varying phase signal. If required for the further processing of the XFMR x(t), a phase-to-frequency conversion, e.g. in a PLL, may be performed after retrieval from the storage and/or in an apparatus to which the XFMR x(t) was transmitted.

Figure 7:
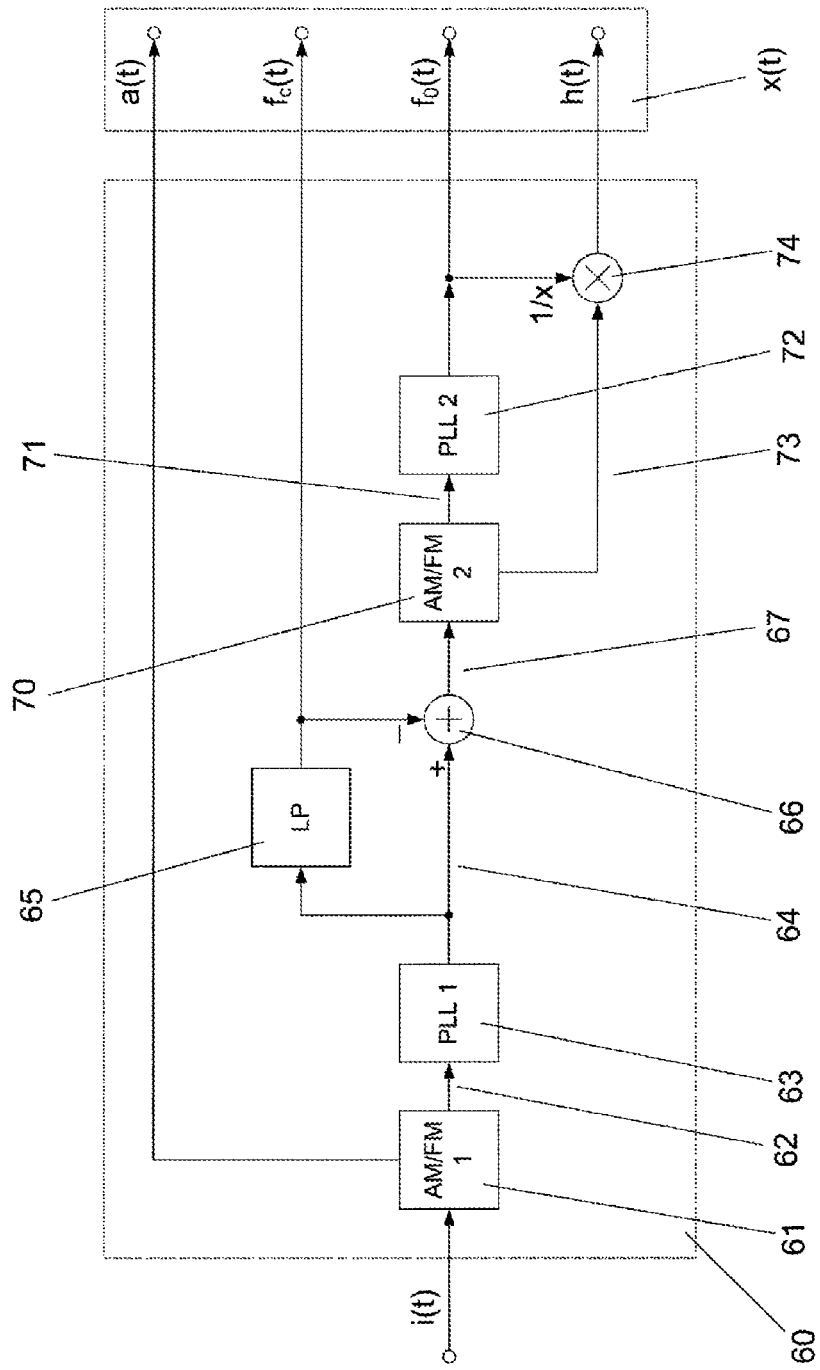
FIG. 7 shows a second embodiment of the FM demodulator of FIG. 6.

In the alternative embodiment shown in FIG. 7, the integrator 68 has been omitted and instead, the AM part output 73 from the second PLL 72 is divided by the pitch signal $f_0(t)$ in a divider 74 to obtain the FM index signal h(t).

In both embodiments, the first and second AM demodulators 61, 70 may each apply any known method for decomposing the respective signals into an AM part and an FM part—and not necessarily the same method. Many such methods are well known in the art (see e.g. Kubo et al. 2011 for a summary). Some of the known methods are based on an analytical signal obtained via the Hilbert Transformation. A further known AM-FM decomposition method is the Discrete Energy Separation Algorithm (DESA) (Bovik, Maragos and Quatieri 1993; Maragos, Kaiser and Quatieri 1993 A; Maragos, Kaiser and Quatieri 1993 B), which is based on the assumption that the signal x(t) is generated by a simple spring-mass system, which allows the DESA to separate a signal into its AM and FM modulators according to principles similar to the separation of kinetic and potential energy. Also, PLL-based AM-FM decomposition methods are known (Wang and Kumaresan 2006; Smith 2006). Decomposition using PLL corresponds to applying a sinusoidal signal model in control theory (cf. Ljung 2000). Alternatively, more complex signal models may be applied. Furthermore, control theory can be replaced by alternative learning models (cf. Jordan 1998).

The carrier frequency signal fat) and/or the pitch signal $f_0(t)$ may alternatively or additionally be estimated from the input audio signal i(t) using pitch trackers known in the art, such as e.g. YIN (de Cheveigné and Kawahara 2002). Such estimates may be used for estimating the remaining XFMR signals, i.e. the amplitude modulation signal a(t) and the FM index signal h(t), in which case the XFM demodulator 60 may be omitted partly or completely. Alternatively, such estimates may be compared to the corresponding outputs, i.e. the carrier frequency signal fat) and/or the pitch signal $f_0(t)$, of the XFM demodulator 60, and the result of the comparison may be used to adaptively adjust filter parameters, such as cut off frequencies and time constants of the filters 61, 65, 70 and PLL 63, 72 of the XFM demodulator 60, in order to improve the accurateness of the XFM demodulation.

In the case that the XFMR x(t) or the modified XFMR x'(t) is to be modulated in a ModFM modulator (Lazzarini and Timoney 2010), the input audio signal i(t) should preferably also be demodulated according to the principles of ModFM, which may produce slightly different values of the carrier frequency signal fat), the pitch signal $f_0(t)$ and the FM index signal h(t) than the XFM demodulators 60 disclosed above. ModFM demodulation thus requires corresponding modifications to the XFM demodulator 60.

When the input audio signal i(t) comprises only one sound, which further is not too complex, an XFM demodulator 60, e.g. in the embodiments shown in FIG. 6 or 7, may be used to directly derive an XFMR x(t) of the sound. The same applies for a sound, which is substantially louder than other sounds in the input audio signal i(t).

If, however, the input audio signal i(t) comprises multiple sounds of the same order of loudness, it will be more difficult to determine the XFMR x(t) for one or more of the sounds. Complex sounds, such as e.g. speech, may themselves consist of multiple "partial" sounds, e.g. formants, and may thus likewise be more difficult to demodulate. Note that in the present context, the term "partial sounds" does not refer to the same as the term "partials". A partial sound, such as e.g. a formant, may comprise any number of partials.

Figure 8:
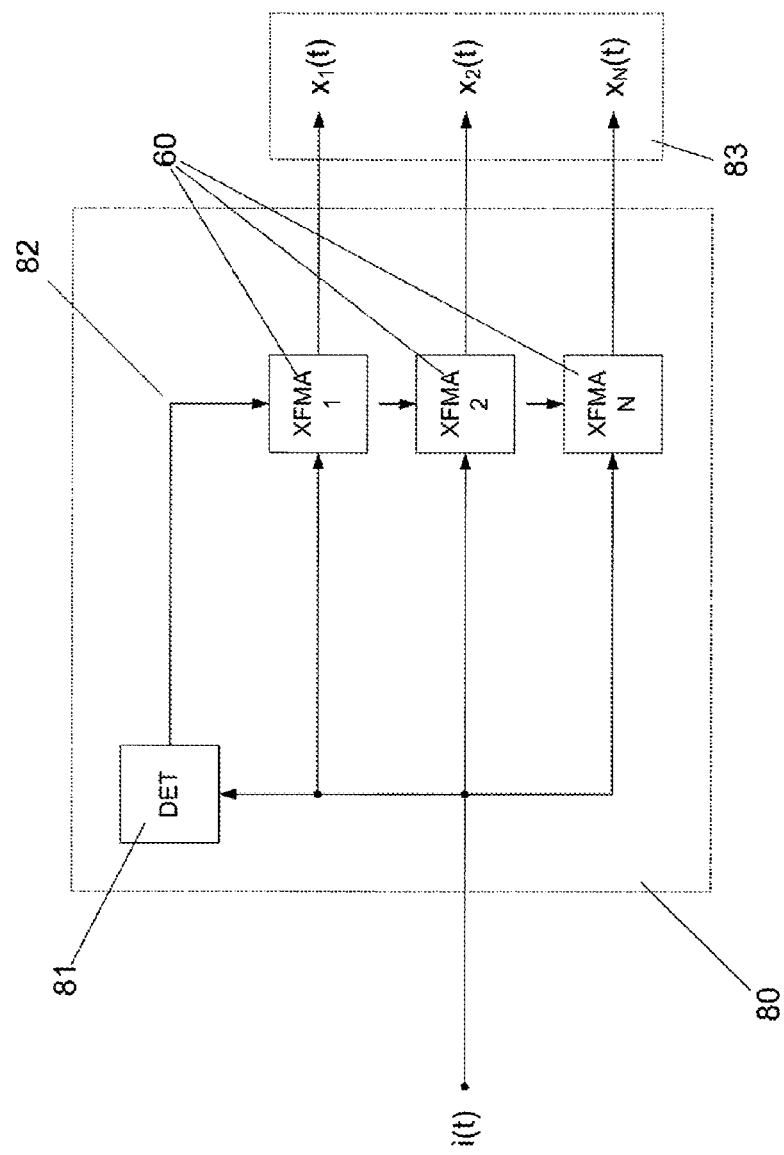
FIG. 8 shows a first embodiment of an FM analyser comprised in further embodiments of the invention.

FIG. 8 shows an XFM analyser 80 capable of demodulating multiple sounds, such as e.g. formants. The XFM analyser 80 comprises multiple, e.g. two, three or more, XFM demodulators 60 connected to a sound detector 81. The sound detector 81 receives the input audio signal i(t), determines the presence and/or properties of sounds, partial sounds and/or formants in the received signal i(t) and controls each XFM demodulator 60 via a respective control signal 82 to demodulate a respective one of the detected sounds, partial sounds and/or formants. Each XFM demodulator 60 provides a separate XFMR $x_1(t) \ldots x_N(t)$, and the XFM analyser 80 thus provides an XFMR set 83 comprising two, three or more XFMR $x_1(t) \ldots x_N(t)$. The sound detector 81 may control the XFM demodulators 60 by setting limitations and/or preferences for one or more of the functional blocks of the XFM demodulators 60, e.g. by setting the cut-off frequencies for the low-pass filters 65 and/or setting the time constants for the PLL 63, 72.

Figure 9:
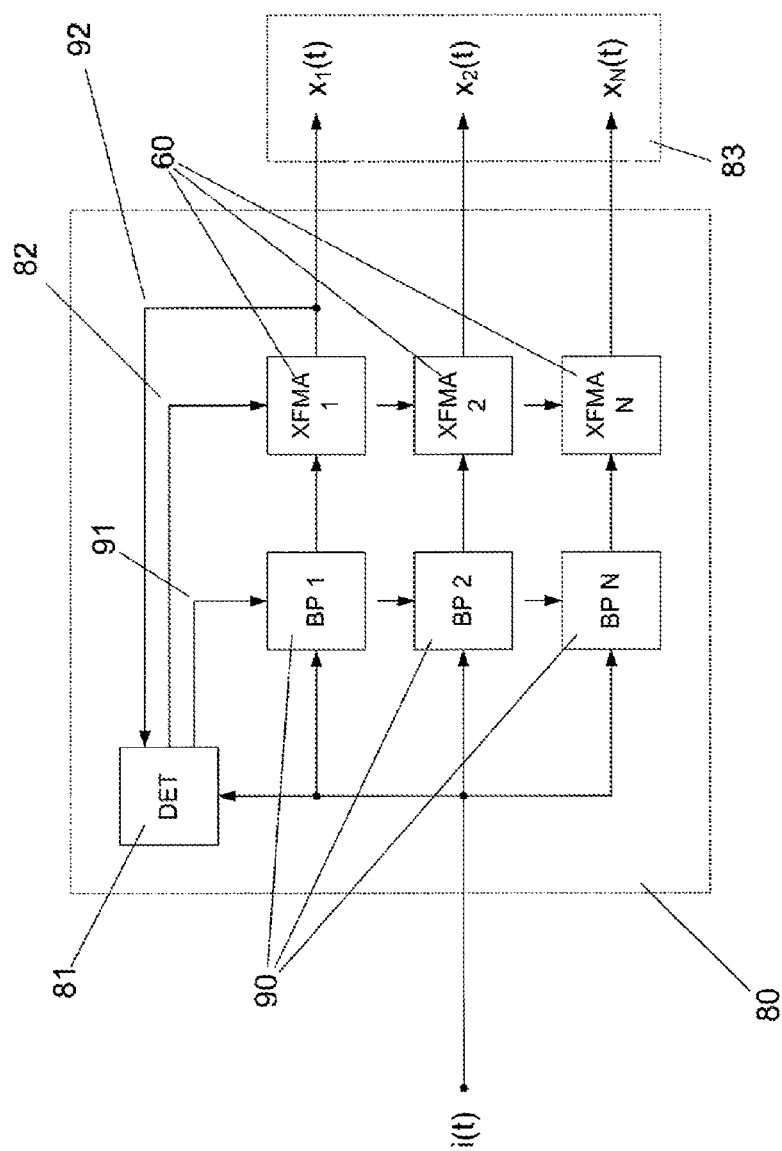
FIG. 9 shows a second embodiment of the FM analyser of FIG. 8.

As shown in FIG. 9, one or more of the XFM demodulators 60 may be preceded by a band-pass filter 90. The sound detector 81 may determine the frequency range occupied by each detected sound, partial sound and/or formant and may control each band-pass filter 90 via a respective control signal 91 to attenuate frequencies outside the respective frequency range before passing the input audio signal i(t) on to the respective XFM demodulator 60. The band-pass filters 90 may thus remove frequencies that could disturb the demodulation in the XFM demodulators 60.

The generation of frequency components in speech mainly takes place in the larynx, whereas the vocal tract applies a frequency filtering to the components with pronounced maxima, i.e. the formants. During each phoneme, a speaker normally varies both the generated frequency components and the formant frequencies independently. The frequency filtering applied by the vocal tract changes the relative amplitudes of the frequency components, such that it becomes more difficult to determine the XFMR x(t)—especially the FM index signal h(t)—from the signal waveform.

The frequency filtering applied by the vocal tract may be at least partly counteracted by a deemphasising filter. The deemphasising filter may thus dampen signal frequencies that are pronounced by the vocal tract and vice versa. Such deemphasising filters may be placed in the signal paths before the respective XFM demodulators 60 and are preferably integrated in the band-pass filters 90. The filter curve of each deemphasising filter may be controlled individually by the sound detector 81, such that the filter curve is substantially the inverse of the respective vocal tract filter curve, at least within a frequency band corresponding to the pass-band of the band-pass filter 90. The deemphasising filters may thus improve the ability of the XFM demodulators 60 to determine the XFMR $x_1(t) \ldots x_N(t)$ of the respective formants. The sound detector 81 may determine the formant frequency and/or the spectral distribution of the detected formants and set the shapes of the filter curves of the deemphasising filters in dependence hereof, or alternatively, set the shapes to correspond with typical formant curves based on statistical data for speech. In both cases, the sound detector 81 may adapt each curve shape, e.g. the width, in dependence on the corresponding determined formant frequency.

Partial sounds originating from a single sound source often share one or more properties. For instance, the pitch is typically identical in some or all formants of speech from a single speaker. Also, the amplitude modulation is often identical in some or all partial sounds making up a complex sound. In some cases, even the carrier frequency and/or the FM index may be shared by the partial sounds. Shared properties may be utilised when deriving the XFMR $x_1(t) \ldots x_N(t)$ of the partial sounds. Thus, the sound detector 81 may analyse the input audio signal i(t) for the presence of a complex sound having partial sounds that share—or supposedly share—a property; determine the value of the shared property; and constrain one or more of the XFM demodulators 60 such that the determined value of the shared property is preserved in their XFMR outputs $x_1(t) \ldots x_N(t)$. Redundant XFMR signals a(t), $f_c(t)$, $f_0(t)$, h(t) may be omitted in the XFMR set 83.

Upon detection of speech in the input audio signal i(t), the sound detector 81 may assume that the formants share the pitch property and proceed accordingly without actually testing this assumption.

The sound detector 81 may determine the presence of and/or the value of the shared property by means of signal analysis as is already well known in the prior art. Alternatively, the sound detector 81 may determine the presence of and/or the value of the shared property by means of one or more of the XFM demodulators 60. This may require that the sound detector 81 receives from said one or more of the XFM demodulators 60 the XFMR signals a(t), $f_c(t)$, $f_0(t)$, h(t) corresponding to the shared property as indicated by connection 92.

The sound detector 81 may constrain the XFM demodulators 60 by setting limitations for one or more of the functional blocks of the XFM demodulators 60, e.g. by setting the cut-off frequencies for the low-pass filters 65 and/or setting the time constants for the PLL 63, 72.

In the case that the input audio signal i(t) comprises complex sounds from more than one sound source, e.g. speech from more than one speaker, the sound detector 81 may group the partial sounds according to shared properties and thus distinguish the sources of the individual sounds. For instance, formants may be grouped by pitch in order to distinguish individual speakers. The sound detector 81 may take further properties of the sounds, e.g. direction of arrival, in account for this grouping. Such further properties may be determined by the sound detector 81 based, e.g. on input audio signals i(t) from multiple microphones. Information of the grouping may be added to the XFMR set 83 in order to allow a subsequent source-dependent processing of the sounds, such as e.g. speech recognition, or emphasising or deemphasising sounds from individual sound sources relative to sounds from other sound sources.

Furthermore, the identity of a speaker may be determined by comparing the XFMR outputs $x_1(t) \ldots x_N(t)$ in the XFMR set 83, or an identified group of XFMR outputs $x_1(t) \ldots x_N(t)$, with a previously stored XFMR set 83 recorded for the same speaker.

Figure 10:
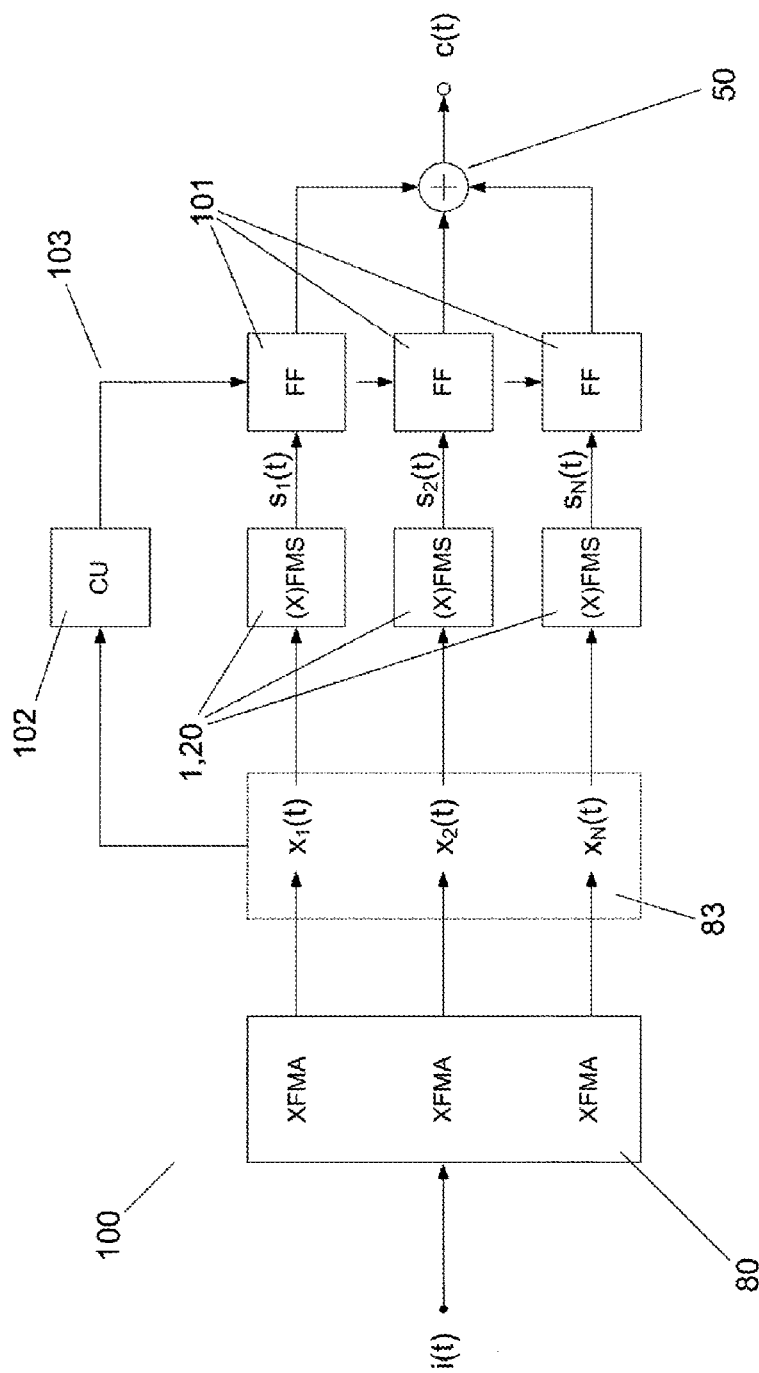
FIG. 10 shows an XFM processor according to an embodiment of the invention.

The XFM processor 100 shown in FIG. 10 comprises an XFM analyser 80 and one, two, three or more (X)FM modulators 1, 20. The XFM processor 100 receives an input audio signal i(t) and provides a composite audio signal c(t), wherein at least one of the sounds has been altered by modifying the amplitude of the corresponding FM index signal h(t). In the XFM processor 100, some or all of the XFMR $x_1(t) \ldots x_N(t)$ comprised in the XFMR set 83 provided by the XFM analyser 80 are subsequently modulated into respective modulated audio signals $s_1(t) \ldots s_N(t)$ by means of the (X)FM modulators 1, 20. The amplitude of one or more of the XFM signals a(t), $f_c(t)$, $f_0(t)$, h(t) in the XFMR $x_1(t) \ldots x_N(t)$ are modified, e.g. as described with respect to the embodiments shown in FIGS. 2, 3 and 4.

For better modulation of XFMR $x_1(t) \ldots x_N(t)$ representing formants, one or more of the (X)FM modulators 1, 20 may be followed by a respective formant filter 101, which at least partly mimics the frequency filtering applied by the vocal tract. The filter curve of each formant filter 101 may be controlled by a control unit 102 via respective control lines 103 in dependence on information comprised in one or more of the XFMR $x_1(t) \ldots x_N(t)$ and/or in the XFMR set 83. Such information may e.g. be provided by a sound detector 81 in the XFM analyser 80 when demodulating the formant. Each formant filter curve is then preferably set to be the inverse of the filter curve of the corresponding deemphasising filter 90 applied before demodulation. Alternatively, the shape of the formant filter curve is set to correspond with typical formant curves based on statistical data for speech. The control unit 102 may set the filter curves of the formant filters 101 to be flat in the case that speech is not detected, or if the respective (X)FM modulators 1, 20 is to modulate a non-formant audio signal. Alternatively, one or more of the formant filters 101 may be circumvented or omitted.

The outputs of the multiple (X)FM modulators 1, 20, and/or of the optional formant filters 101, may be combined in an adder 50. In this way, the XFM processor 100 may provide a composite audio signal c(t) comprising more or less complex sounds from one or more sound sources, such as e.g. speech from one or more individual speakers. By modifying one or more of the XFM signals a(t), fat), $f_0(t)$, h(t) in one or more of the XFMR $x_1(t) \ldots x_N(t)$, the XFM processor 100 may modify properties of the individual sounds and/or sound sources, e.g. their apparent loudness, and thus change the sound picture.

To the extent that the XFM analyser 80 manages to demodulate the XFMR $x_1(t) \ldots x_N(t)$ correctly, missing spectral components in the input audio signal i(t) will automatically be recreated in the composite audio signal c(t). This is a further side-effect of the XFM processing in the XFM processor 100 that may be of particular benefit to hearing-impaired listeners. XFM processing thus generally allows increasing the clarity of the sound picture.

Figure 11:
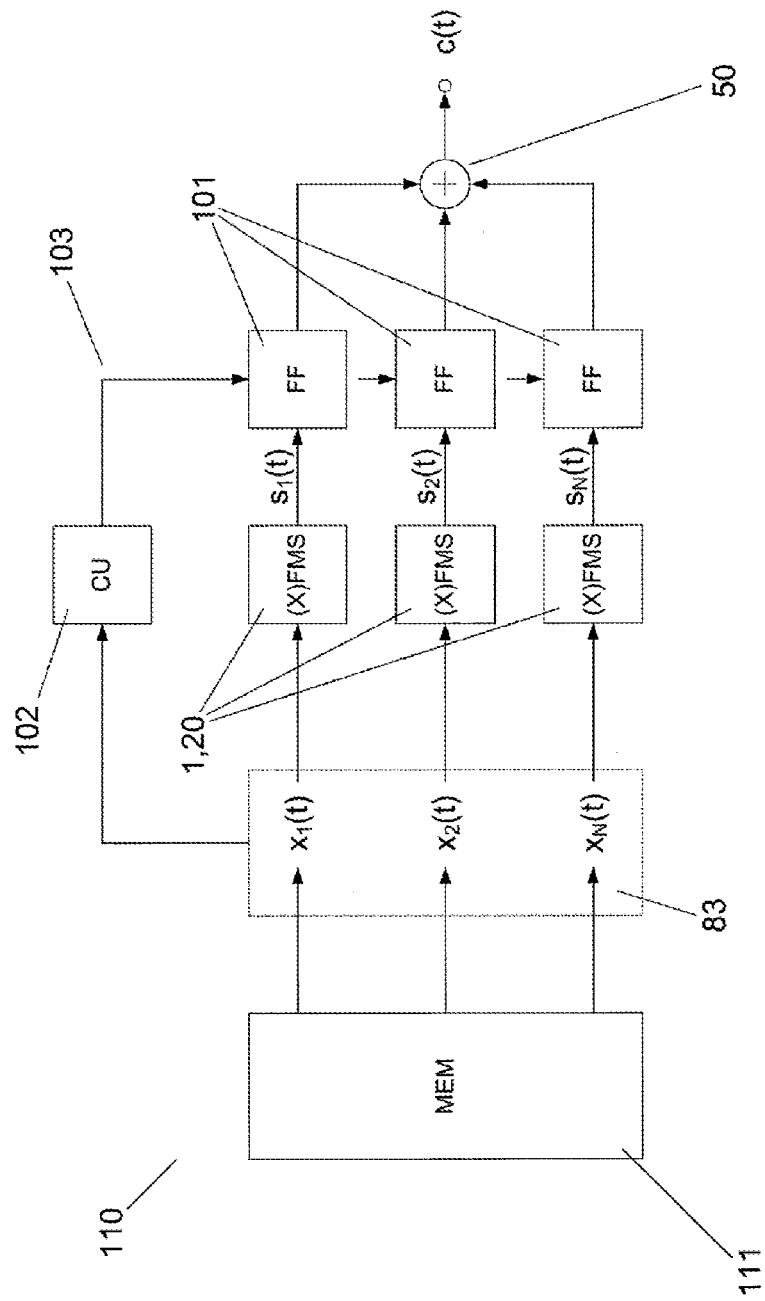
FIG. 11 shows a speech synthesiser according to an embodiment of the invention.

The speech synthesiser 110 shown in FIG. 11 resembles the XFM processor 100 of FIG. 10; however, instead of the XFM analyser 80 it comprises a non-volatile memory 111 forming a formant bank. A number of XFMR $x_1(t) \ldots x_N(t)$ representing formants are pre-stored in the formant bank 111. The pre-stored XFMR $x_1(t) \ldots x_N(t)$ may e.g. have been derived from one or more input audio signals i(t) by means of an XFM analyser 80, an XFM demodulator 60 and/or any other suitable speech demodulation or speech analysis means, and/or they may be synthesised.

The speech synthesiser 104 retrieves one or more of the XFMR $x_1(t) \ldots x_N(t)$ representing one or more formants from the formant bank 111; modifies the amplitude of the FM index signal h(t) of at least one of the retrieved XFMR $x_1(t) \ldots x_N(t)$ in one or more XFM modulators 20; optionally filters the modulated audio signals s(t) in respective formant filters 101; and subsequently in an adder 50 combines the resulting formant signals into a composite signal c(t). The speech synthesiser 104 thus creates synthesised speech from pre-stored formant XFMR $x_1(t) \ldots x_N(t)$. Modifying the amplitude of at least one of the FM index signals h(t) causes a corresponding modification of the vocal effort in the synthesised speech. Similarly, modifying the amplitudes of one or more of the other XFM signals a(t), fat), $f_0(t)$ may be used to change other characteristics of the synthesised speech, such as pitch, vibrato, intonation and formant frequencies. The control unit 102 may control the formant filters 101 to set individual formant frequencies and formant shapes for each synthesised formant. Synthesised speech for one or more speakers may thus be created. Such synthesised speech may e.g. be mixed with noise signals for testing ASR systems.

The outputs from one or more XFM processors 100 and/or one or more speech synthesisers 110 may be combined to create a composite audio signal c(t) with a complex sound picture. In this case, a common adder 50 may be used to create the composite audio signal c(t) from the modulated audio signals $s_1(t)$.

One or more XFM processors 100 and/or one or more speech synthesisers 110 may be combined in an audio processing system, such as e.g. an audio broadcast system, an audio communication system, a voice radio system, a cell phone or a cell-phone system, a telephone or a telephone system, a television or a television system, an automatic speech recognition system, audio reconstruction system, a public address system or a hearing system, or in an audio processing apparatus, such as a hearing device. In such systems or apparatus, one or more input audio signals i(t) may be derived from one or more input transducers, and the resulting modulated audio signals $s_1(t)$ and/or composite audio signals c(t) may be fed to one or more output transducers.

Figure 12:
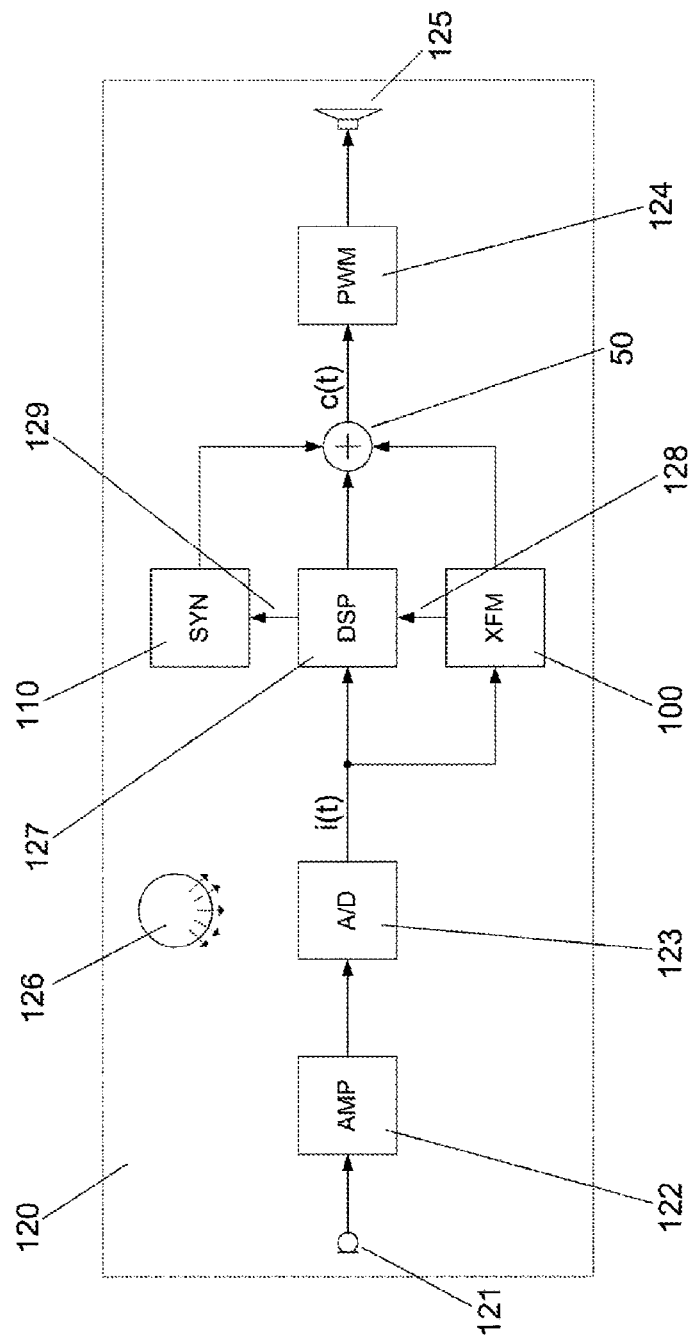
FIG. 12 shows an audio processing apparatus according to an embodiment of the invention.

FIG. 12 shows an audio processing apparatus 120, such as a hearing device, e.g. a hearing aid or an active ear-protection device, comprising an XFM processor 100 as described above, an optional speech synthesiser 110 as described above and an adder 50. The audio processing apparatus 120 may further comprise a microphone 121, a preamplifier 122 and a digitiser 123 connected to form an input signal path. The microphone 121 may be arranged to receive the acoustic input signal, e.g. from an individual's surroundings, and provide a corresponding microphone signal to the preamplifier 122. The preamplifier 122 is adapted to amplify the microphone signal and provide the amplified microphone signal to the digitiser 123. The digitiser 123 is adapted to digitise the amplified microphone signal and provide a digitised input audio signal i(t) to the XFM processor 100.

The XFM processor 100 modifies the digitised audio signal as described above and in accordance with the purpose of the audio processing apparatus 120, e.g. to improve or augment the hearing capability of the individual. The XFM processor 100 may comprise further signal processing circuits (not shown), such as circuits for level compression, circuits for feedback suppression, circuits for noise reduction, etc., as is already known in the art of audio processing and/or in the art of hearing devices.

The outputs of the XFM processor 100 and the speech synthesiser 110 are combined in the adder 50 to form a composite audio signal c(t). The audio processing apparatus 120 may further comprise a pulse-width modulator or another type of amplifier 124 and a loudspeaker 125 connected to form an output signal path. The adder 50 is adapted to provide the composite audio signal c(t) to the pulse-width modulator or amplifier 124, which is adapted to provide a corresponding pulse-width modulated or amplified signal to the loudspeaker 125. The audio processing apparatus 120 may be adapted to be arranged at or in an ear of the individual, and the loudspeaker 125 is arranged to transmit an acoustic output signal corresponding to the pulse-width modulated signal to the individual or a group of individuals. The audio processing apparatus 120 may also comprise a battery 126 for powering the various electronic circuits of the audio processing apparatus 120.

The audio processing apparatus 120 may further comprise a signal processor 127 adapted to receive the input audio signal i(t) and modify it into an output signal provided to the adder 50. The signal processor 127 may perform such modifications to the input audio signal i(t) which are already known in the art, e.g. in order to improve or augment the hearing capability of the individual. The signal processor 127 may further comprise a filter (not shown) or otherwise be adapted to filter the input audio signal i(t) to remove from it signal portions corresponding to sounds or partial sounds that are demodulated in the XFM analyser 80 of the XFM processor 100. The XFM processor 100 may determine corresponding information, e.g. spectral distribution, from the input audio signal i(t) and/or from the demodulated signal x(t) and provide the information to the signal processor 127 via a control line 128. Thus, the composite audio signal c(t) may comprise a first set of sounds that are mainly processed in the XFM processor 100 and a second set of sounds that are mainly processed in the signal processor 127. For instance, distinct sounds, such as e.g. speech, engine sounds, musical instrument sounds etc., may be mainly processed in the XFM processor 100, while sounds that may not easily or not at all be demodulated in the XFM analyser 80, such as e.g. diffuse noise or wind noise, may be mainly processed in the signal processor 127.

In the case that it is not desired to reproduce a demodulated sound or partial sound in the composite audio signal c(t), the XFM processor 100 may refrain from modulating the corresponding demodulated signal x(t). Furthermore, instead of actually modulating the demodulated and possibly modified XFMR x(t), x'(t), $x_1(t) \ldots x_N(t)$, the XFM processor 100 may determine and/or predict the spectral contents of the corresponding waveform audio signals $s_1(t) \ldots s_N(t)$ and provide information of these spectral contents to the signal processor 127, which in turn may use the information to add corresponding spectral content to the input audio signal i(t). This may, depending on the quality of the demodulation, reduce undesired artefacts in the composite audio signal c(t).

The speech synthesiser 110 has a control line 129 for controlling it to e.g. issue audible warnings in the form of synthesised speech, e.g. when the battery voltage is low, to inform the user of state changes, to provide standard messages in a public-address system, etc. Control of the speech synthesiser 110 as well as of other functional units in the audio processing apparatus 120 may be executed by a control unit (not shown), which may be a separate unit or a unit comprised in the signal processor 127 or in the XFM processor 100.

The audio processing apparatus 120 may be a hearing device being part of a binaural hearing system, in which case radio transceivers (not shown) may be comprised via which the XFM processor 100, the signal processor 127 and/or the control unit may exchange data, such as e.g. settings, audio signals and user commands, with a second hearing device 120. A hearing-impaired listener's ability to decode interaural time differences (ITD) may be improved by identically amplifying the FM index signal h(t) for sounds processed in the left-ear and the right-ear hearing device in a binaural hearing system.

Figure 13:
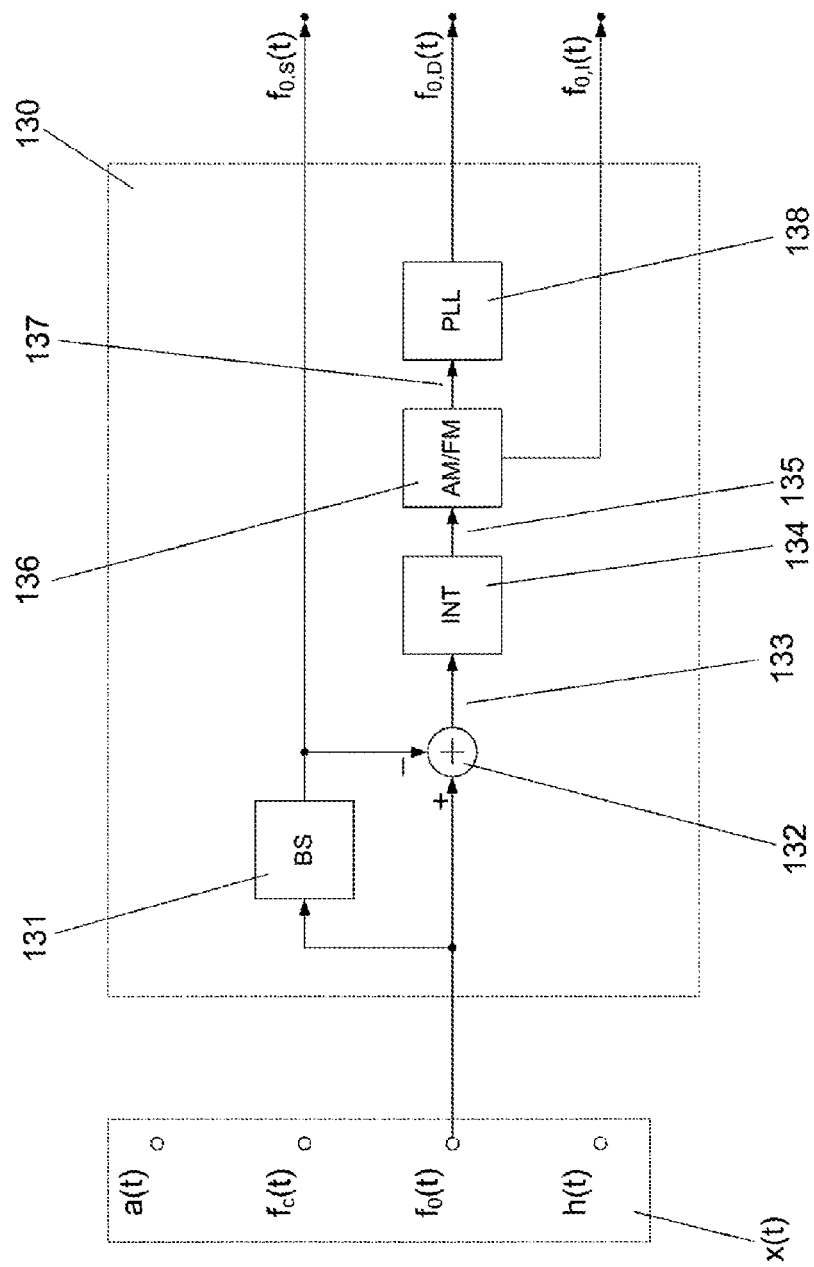
FIG. 13 shows further demodulation comprised in further embodiments of the invention.

FIG. 13 shows in a functional block diagram a pitch demodulator 130, which may be comprised in further embodiments of the invention. The pitch demodulator 130 takes as input a waveform pitch signal $f_0(t)$ of an XFMR x(t), e.g. demodulated by an XFM demodulator 60, and provides a smoothed pitch signal $f_{0,s}(t)$, a pitch deviation rate signal $f_{0,D}(t)$ and a pitch deviation range signal $f_{0,r}(t)$ as output. The pitch demodulator 130 functions similarly to an XFM demodulator 60, however without the initial AM/FM decomposition, and thus provides only a frequency demodulation of the pitch signal $f_0(t)$. The smoothed pitch signal $f_{0,s}(t)$, the pitch deviation rate signal $f_{0,D}(t)$ and the pitch deviation range signal $f_{0,r}(t)$ relate to the pitch signal $f_0(t)$ in the same way as the carrier frequency signal $f_c(t)$, the pitch signal $f_0(t)$ and the FM index signal h(t) of an XFMR x(t) relate to the audio input signal i(t), and they may thus be modulated into a modulated pitch signal $f_{0,M}(t)$ by means of an (X)FM modulator 1, 20, with the amplitude modulation signal a(t) set to a constant value, such as unity. Alternatively, the AM multiplier 10 in the (X)FM modulator 1, 20 may be omitted.

A band-stop filter 131 receives the pitch signal $f_0(t)$ and determines the smoothed pitch signal $f_{0,s}(t)$ by at least partly removing modulating signals from the pitch signal $f_0(t)$. The band-stop filter 131 has a lower corner frequency of e.g. 1, 2 or 3 Hz and an upper corner frequency of e.g. 10, 20 or 50 Hz. The band-stop filter 131 preferably has lower and upper slopes with a decay of e.g. 6 dB/octave, 12 dB/octave or 24 dB/octave. A subtractor 132 determines a pitch deviation signal 133 as the difference between the pitch signal $f_0(t)$ and the smoothed pitch signal $f_{0,s}(t)$. The pitch deviation signal 133 thus mainly comprises signal frequencies within the stop-band of the band-stop filter 131, whereas the smoothed pitch signal $f_{0,s}(t)$ is typically slowly varying, i.e. with a frequency below the stop-band, but may comprise modulations with a frequency above the stop-band and/or abrupt level shifts, e.g. when a speaker abruptly changes the pitch.

An integrator 134 integrates the pitch deviation signal 133 into a normalised pitch deviation signal 135. An AM demodulator 136 decomposes the normalised pitch deviation signal 135 into the pitch deviation range signal $f_{0,r}(t)$ representing the AM part of the normalised pitch deviation signal 135 and a phase signal 137 representing the FM part of the normalised pitch deviation signal 135. The phase signal 137 is provided as input to a PLL 138, which has a time constant adapted to allow it to follow the fastest expected frequency variations in the normalised pitch deviation signal 135, e.g. about 60 Hz, about 80 Hz, about 100 Hz or above 100 Hz. The PLL 138 functions in known fashion and provides the pitch deviation rate signal $f_{0,D}(t)$, which represents the instantaneous frequency of the phase signal 137.

Vat's results suggest that hearing-impaired listeners require larger pitch deviations to achieve the same perception of "normalness" of speech as normal-hearing listeners (Vatti 2010). Moreover, in a sound demonstration in 1980, Chowning showed that normal-hearing listeners can use deviations from a smoothed pitch to segregate simultaneous sounds. Larger pitch deviations may be achieved by amplifying the pitch deviation range signal $f_{0,r}(t)$ before modulation into a modified pitch signal $f'_0(t)$. Such modification may be implemented by means of apparatus, systems and methods identical, or nearly identical, to those disclosed further above for modifying and modulating an XFMR x(t). The resulting modified pitch signal $f'_0(t)$ with larger deviations from the smoothed pitch signal $f_{0,s}(t)$ may thus be used to at least partly compensate for a hearing-impaired listener's different perception and improve his or her ability to utilise pitch deviations as a grouping cue in situations with multiple speakers. Using the above mentioned lower and upper corner frequencies for the band-stop filter 131 allows the pitch deviation signal 133 to comprise pitch variations that are particularly important for the perception of speech and the identification of speakers.

The modified pitch signal $f'_0(t)$ may be processed further as part of an XFMR x(t) or a modified XFMR x'(t) as disclosed further above. Amplification of the pitch deviation range signal $f_{0,r}(t)$ may thus be implemented in any of the above disclosed methods, apparatus and/or systems, however with particular relevance in hearing devices and hearing systems.

Figure 14:
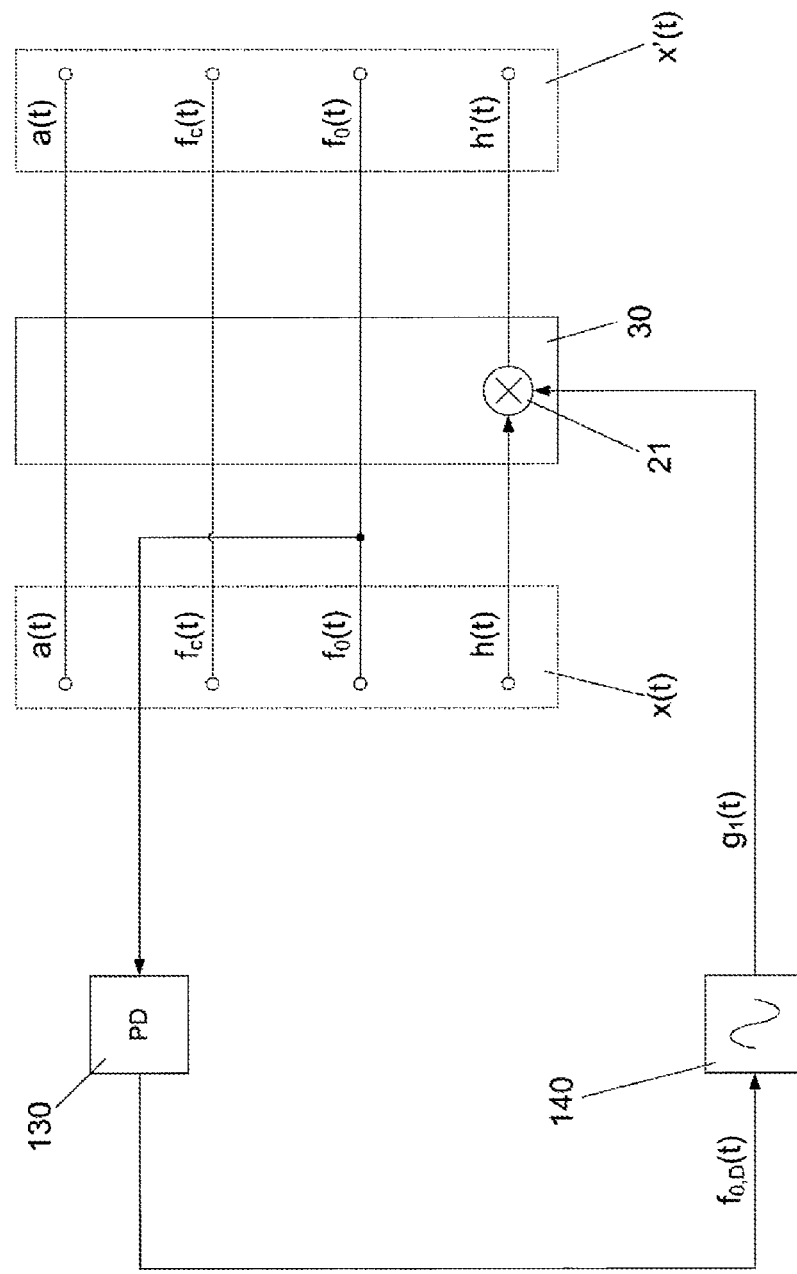
FIG. 14 shows an embodiment of speech enhancement comprised in further embodiments of the invention.

FIG. 14 shows in a functional block diagram an embodiment of speech enhancement, which may be comprised in further embodiments of the invention. In any of the methods, apparatus and systems disclosed above, speech enhancement may be achieved by determining pitch deviations in an XFMR x(t) comprising speech and modifying the FM index signal h(t) of the XFMR x(t) synchronously with the determined pitch deviations. The pitch deviations may be determined by a pitch demodulator 130, e.g. as the one disclosed above, which receives the pitch signal $f_0(t)$ of the XFMR x(t) and provides a corresponding pitch deviation rate signal $f_{0,D}(t)$. An oscillator 140 may provide the first gain signal $g_1(t)$ input to an XFMR modifier 30 as an oscillating signal with constant amplitude and a frequency corresponding to the pitch deviation rate signal $f_{0,D}(t)$. The amplitude of the oscillator 140 may be varied to control the amount of speech enhancement.

The above disclosed speech enhancement allows for increasing the audibility of pitch variations, as they will be represented as a modulation of the spectrum itself, and may thus be of particular benefit to hearing-impaired listeners. Lunner and Pontoppidan described a similar effect of applying amplitude modulation to a speech signal, wherein the amplitude modulation is a function of the frequency modulation in the speech signal (Lunner and Pontoppidan 2008).

Figure 15:
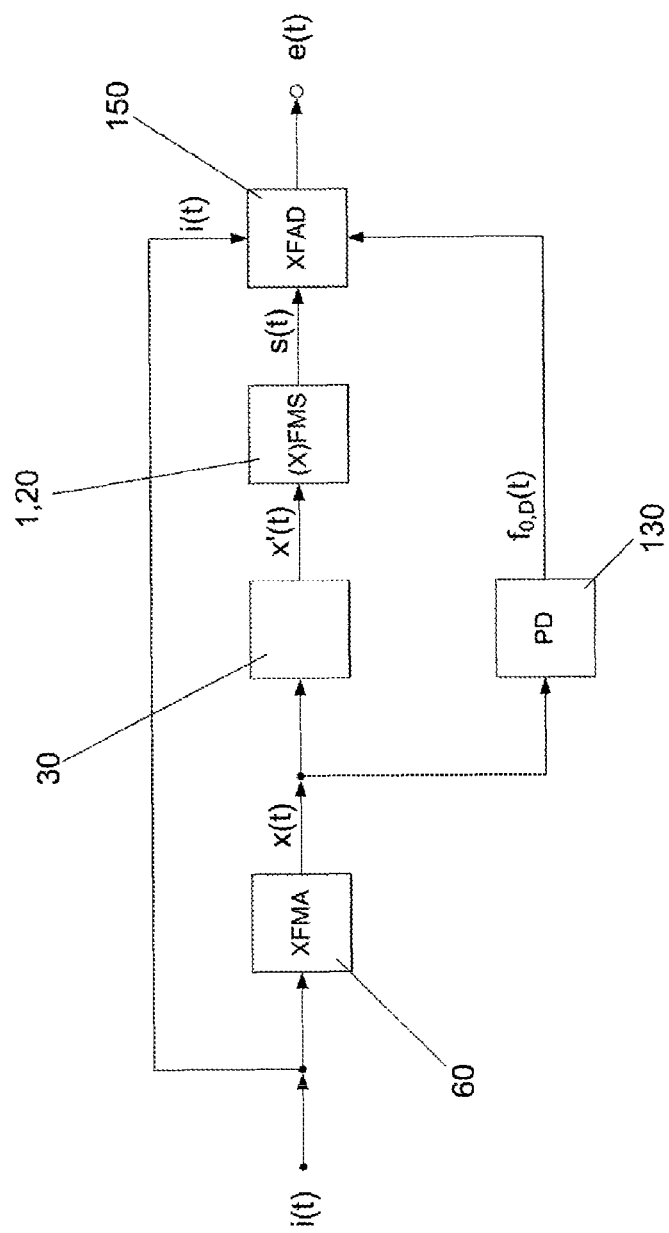
FIG. 15 shows a further embodiment of speech enhancement comprised in further embodiments of the invention.

FIG. 15 shows in a functional block diagram a further embodiment of speech enhancement, which may be comprised in further embodiments of the invention. In this embodiment of speech enhancement, a similar modulation of the spectrum is achieved by cross-fading between an input audio signal i(t) and a modulated audio signal s(t) synchronously to the pitch deviations, where the modulated signal s(t) is modulated from a modified XFMR x'(t) of the input audio signal i(t). An XFM demodulator 60 receives the input audio signal i(t) and provides a corresponding XFMR x(t) as described further above. An XFMR modifier 30 modifies the FM index signal h(t) of the XFMR x(t) and provides a modified XFMR x'(t) with a modified FM index signal h'(t) as described further above. An (X)FM modulator 1, 20 receives the modified XFMR x'(t) and provides a corresponding modulated audio signal s(t) as described further above. A pitch demodulator 130, e.g. as disclosed above, receives the FM index signal h(t) and provides a corresponding pitch deviation rate signal $f_{0,D}(t)$. A cross-fader 150 receives the input audio signal i(t), the modulated audio signal s(t) and the pitch deviation rate signal $f_{0,D}(t)$ and provides an enhanced audio signal e(t) according to the following equation:

$$e(t)=\alpha i(t)+(1-\alpha)s(t), \quad (7)$$

where the fading factor α is defined by:

$$\alpha = \tfrac{1}{2}+\cos 2\pi f_{0,D}(t)/2. \quad (8)$$

The enhanced audio signal e(t) thus changes forth and back between the input audio signal i(t) and the modulated audio signal s(t) with the same frequency as the one with which the pitch signal $f_0(t)$ of the XFMR x(t) varies around the smoothed pitch signal $f_{0,s}(t)$. The amount of amplification or attenuation of the FM index signal h(t) required to actually increase the audibility of the pitch variations depends on the hearing-impairment of the individual. The constants in the equations (7) and (8) may be modified to obtain other cross-fading ratios.

The speech enhancement shown in FIG. 15 may replace or be added to the speech enhancement shown in FIG. 14 in any of the methods, apparatus and systems disclosed above.

Embodiments of the invention are preferably implemented mainly as digital circuits operating in the discrete time domain, but any or all parts hereof may alternatively be implemented as analog circuits operating in the continuous time domain. Accordingly, any of the input audio signal i(t), the XFMR signals a(t), $f_c(t)$, $f_0(t)$, h(t), the modified XFMR signals a'(t), $f_c'(t)$, $f_0'(t)$, h'(t), the pitch-demodulated signals $f_{0,s}(t)$, $f_{0,D}(t)$, $f_{0,I}(t)$, the modulated audio signals s(t), $s_N(t)$, the composite audio signal c(t) and the enhanced signal e(t) may, any number of times and anywhere in the signal chain, be converted between the digital and analog representation and/or vice versa as required, e.g. in an audio processing system comprising multiple apparatus. In analog circuits, multipliers 4, 10, 21, 42, 43, 44, 74 may e.g. be implemented as gain-controllable amplifiers.

Digital functional blocks of the embodiments may be implemented in any suitable combination of hardware, firmware and software and/or in any suitable number and combination of hardware units. Furthermore, any single hardware unit may execute the operations of several functional blocks in parallel, sequentially, in interleaved sequence and/or in any suitable combination thereof. In particular, a single XFM demodulator 60 may iteratively demodulate multiple XFMR x(t) from a single repeated input audio signal i(t), and a single (X)FM modulator 1, 20 may sequentially modulate multiple XFMR x(t) into multiple modulated audio signals s(t) which may be subsequently aligned in time in a delay unit and added.

The functional blocks of the embodiments may be implemented in different apparatus comprised in an audio processing system, in which case the respective functional blocks should be connected by means of appropriate transmission means. Alternatively, embodiments may be implemented in single audio processing apparatus.

Some preferred embodiments have been described in the foregoing, but it should be stressed that the invention is not limited to these, but may be embodied in other ways within the subject-matter defined in the following claims. For example, the features of the described embodiments may be combined arbitrarily, e.g. in order to adapt the system, the apparatus and/or the method according to the invention to specific requirements.

It is further intended that the structural features of the system and/or apparatus described above, in the detailed description of 'mode(s) for carrying out the invention' and in the claims can be combined with the methods, when appropriately substituted by a corresponding process. Embodiments of the methods have the same advantages as the corresponding systems and/or apparatus.

Further modifications obvious to the skilled person may be made to the disclosed method, system and/or device without deviating from the scope of the invention. Within this description, any such modifications are mentioned in a non-limiting way.

Any reference numerals and names in the claims are intended to be non-limiting for their scope.

REFERENCES

Andersen M R., Kristensen M S., Neher T. and Lunner T. 2010. Effect of Binaural Tone Vocoding on Recognising Target Speech Presented Against Spatially Separated Speech Maskers (IHCON Poster).

Boldt J B., Kjems U., Pedersen M S., Lunner T. and Wang D. 2008. Estimation of the ideal binary mask using directional systems. Paper presented at IWAENC 2008.

Bovik A C., Maragos P. and Quatieri T F. 1993. AM-FM Energy Detection and Spearation in Noise using Multiband Energy Operators. IEEE transactions on Signal Processing 41 (12), pages 3245-3265.

Bregman A S. 1990. Auditory Scene Analysis. Cambridge, Mass.: MIT Press.

Chowning J. 1973. The synthesis of complex audio spectra by means of frequency modulation. Journal of the Audio Engineering Society 21 (7), pages 526-534.

Chowning J M. 2000. Digital sound synthesis, acoustics and perception: A rich intersection. Paper presented at COST G-6 Conference on Digital Audio Effects (DAFX-00), at Verona, Italy.

Chowning J M. 1980. Computer synthesis of the singing voice. Paper presented at Sound generation in Winds, Strings and Computers, Kungl. Musikaliska Akademien, Stockholm Sweden.

de Cheveigné A. and Kawahara H. 2002. YIN, a fundamental frequency estimator for speech and music. The Journal of the Acoustical Society of America 111 (4), pages 1917-1030.

Elberling C., Ekelid M. and Ludvigsen C. 1991. A method and an apparatus for classification of a mixed speech and noise signal. Patent application WO 91/03042 A1.

Folk L. and Schiel F. 2011. The Lombard Effect in Spontaneous Dialog Speech. Paper presented at Interspeech 2011.

Heinz M G., Swaminathan J., Boley J D. and Kale S. 2010. Across-fiber coding of temporal fine-structure: Effects of noise-induced hearing loss on auditory-nerve responses. The Neurophysiological Bases of Auditory Perception, pages 621-630.

Hopkins K. and Moore B C J. 2011. The effects of age and cochlear hearing loss on temporal fine structure sensitivity, frequency selectivity and speech reception in noise. The Journal of the Acoustical Society of America 130 (1), pages 334-349.

Hopkins K. and Moore B C J. 2007. Moderate cochlear hearing loss leads to a reduced ability to use temporal fine structure information. J. Acoust. Soc. Am. 122 (2), pages 1055-1068.

Hopkins K., Moore B C J. and Stone M A. 2008. Effects of moderate cochlear hearing loss on the ability to benefit from temporal fine structure information in speech. Journal of the Acoustical Society of America 123 (2), pages 1140-1153.

Jordan M I. 1998. Learning in graphical models. Kluwer Academic Publishers.

Kubo Y., Okawa S., Kurematsu A. and Shirai K. 2011. Temporal AM-FM combination for robust speech recognition. Speech Communication 53 (5), pages 716-725.

Lazzarini V. and Timoney J. 2010. Theory and Practice of Modified Frequency Modulation Synthesis. Journal of the Audio Engineering Society 58 (6), pages 459-471.

Lindblom B. 1996. Role of articulation in speech perception: Clues from production. Journal of the Acoustical Society of America 99 (3), pages 1683-1692.

Ljung L. 1999. System identification. Wiley Encyclopedia of Electrical and Electronics Engineering.

Lunner T., Hietkamp R K., Andersen M R., Hopkins K. and Moore B C J. 2011. Effect of speech material on the benefit of temporal fine structure information in speech for normal-hearing and hearing-impaired subjects. Submitted to Ear & Hearing.

Lunner T. and Pontoppidan N H. 2008. N band F M demodulation to aid cochlear hearing impaired persons. Patent application EP 2 184 929 A1.

Maragos P., Kaiser J F. and Quatieri T F. 1993 A. Energy separation in signal modulations with application to speech analysis. IEEE transactions on Signal Processing 41 (10), pages 3024-3051.

Maragos P., Kaiser J F. and Quatieri T F. 1993 B. On Amplitude and Frequency Demodulation Using Energy Operators. IEEE transactions on Signal Processing 41 (4), pages 1532-1550.

Micheyl C., Keebler M V. and Oxenham A J. 2010. Pitch perception for mixtures of spectrally overlapping harmonic complex tones. Journal of the Acoustical Society of America 128 (1), pages 257-269.

Moore B C J. and Sek A. 2009. Development of a fast method for determining sensitivity to temporal fine structure. International Journal of Audiology 48 (4), pages 161-171.

Moore B C J. and Glasberg B R. 2004. A revised model of loudness perception applied to cochlear hearing loss. Hearing Research 188, pages 70-88.

Moore B C J. and Skrodzka E. 2002. Detection of frequency modulation by hearing-impaired listeners: Effects of carrier frequency, modulation rate and added amplitude modulation. The Journal of the Acoustical Society of America 111 (1), pages 327-335.

Neher T. and Behrens T. 2007. Frequency transposition applications for improving spatial hearing abilities for subjects with high-frequency hearing loss. Patent application EP 2 026 601 A1.

Neher T. 2008. Hearing device, hearing aid system, method of operating a hearing aid system and use of a hearing device. Patent application EP 2 091 266 A1.

Nie K., Stickney G. and Zeng F-G. 2005. Encoding Frequency Modulation to Improve Cochlear Implant Performance in Noise. IEEE Transaction on Biomedical Engineering 52 (1), pages 64-73.

Potamianos A. and Maragos P. 1999. Speech analysis and synthesis using an AM-FM modulation model. Speech Communication 28 (1999), pages 195-209.

Ruggles D., Bharadwaj H. and Shinn-Cunningham B G. 2011. Normal hearing is not enough to guarantee robust encoding of suprathreshold features important in everyday communication. Proc. Natl. Acad. Sci. U. S. A 108 (37), pages 15516-15521.

Schimmel S M. 2007. Theory of Modulation Frequency Analysis and Modulation Filtering with Applications to Hearing Devices. PhD Theory of Modulation Frequency Analysis and Modulation Filtering with Applications to Hearing Devices, University of Washington.

Smith JSR. 2006. Apparatus for and method of signal processing. Patent application WO 2006/032917.

Teager H M. 1980. Some Observations on Oral Air Flow During Phonation. IEEE transactions on acoustics, speech and signal processing 28 (5), pages 599-601.

Teager H M. and Teager S M. 1990. Evidence for nonlinear sound production mechanisms in the vocal tract. In Speech production and speech modelling, eds W J Hardcastle and A Marchal, pages 241-261. Kluwer.

Valli M. 2010. Consequences of hearing impairment in auditory scene analysis. Master's thesis. Technical University of Denmark.

Wang Y. and Kumaresan R. 2006. Real Time Decomposition of Speech into Modulated Components. Journal of the Acoustical Society of America 119 (6), pages EL68-EL73.

Winkler T. 2011. How realistic is Artificially Added Noise? Paper presented at Interspeech 2012.

Yasu K., Ishida K., Takahashi R., Arai T., Kobayashi T. and Shindo M. 2008. Critical-band compression method of speech enhancement for elderly people: Investigation of syllable and word intelligibility.

Zeng F G., Nie K., Stickney G S., Kong Y Y., Vongphoe M., Bhargave A., Wei C. and Cao K. 2005. Speech recognition with amplitude and frequency modulations. Proceedings of the National Academy of Sciences 102 (7), pages 2293-2298.

Zeng F-G. and Nie K-B. 2007. Cochlear implants and apparatus/methods for improving audio signals by use of frequency-amplitude-modulation-encoding (FAME) strategies. U.S. Pat. No. 7,225,027.

Zhou G., Hansen JHL. and Kaiser J F. 2001. Nonlinear Feature Based Classification of Speech Under Stress. IEEE Transactions on Speech and Audio Processing 9 (3), pages 201-216.

The invention claimed is:

1. A method for processing an audio signal i(t) representing a processable representation of a first sound in an audio processing apparatus, the method comprising:

receiving the audio signal i(t) at a signal processor and at an extended frequency modulation (XFM) processor;

filtering the received audio signal i(t) in the signal processor to remove signal portions corresponding to sounds or partial sounds that are demodulated by the XFM processor of the audio processing apparatus;

generating by the XFM processor an extended frequency modulation representation (XFMR) x(t) of a first sound comprised in the audio signal i(t), x(t) being a set of time-varying signals including an amplitude modulation signal a(t) representing an envelope of the first sound, a carrier frequency signal $f_c(t)$ representing a frequency modulation carrier frequency of the first sound, a pitch signal $f_0(t)$ representing a fundamental frequency and/or pitch of the first sound, and a frequency modulation index signal h(t) representing a frequency modulation index of the first sound;

determining spectral content of the set x(t) by the XFM processor;

providing information about the spectral content by the XFM processor to the signal processor;

modifying the audio input signal i(t) by the signal processor based on the information about the spectral content received from the XFM processor to produce a first output signal to an adder; and adding an output of the XFM processor to the first output signal to produce a composite signal c(t).

2. The method according to claim 1, further comprising: amplifying the composite signal c(t).

3. The method according to claim 2, further comprising: supplying the amplified composite signal c(t) to a loudspeaker and outputting sound by the loudspeaker.

4. The method according to claim 1, further comprising: supplying power to the signal processor and the XFM processor by a battery inside the audio processing apparatus.

5. The method according to claim 1, further comprising: connecting a speech synthesizer to the signal processor by a second control line; and
synthesizing speech to generate audible warnings in response to control signals from the signal processor.

6. An audio processing apparatus, comprising:
a microphone configured to convert sound to an electric microphone signal and provide said electric microphone signal to a preamplifier;
the preamplifier amplifying the electric microphone signal from the microphone and outputting an amplified electric microphone signal to a digitizer;
the digitizer converting the amplified electric microphone signal to a digitized input audio signal i(t) and outputting said digitized input audio signal i(t) to a signal processor and an extended frequency modulation (XFM) processor;
the XFM processor demodulating the digitized input audio signal i(t) into an extended frequency modulation representation (XFMR) x(t) of the digitized input audio signal i(t), determining spectral content of the demodulated XFMR signal x(t), and providing information about the spectral content to the signal processor via a control line;
the signal processor including a filter that removes signal portions corresponding to sounds or partial sounds that are demodulated in the XFM processor and modifying the digitized input audio signal i(t) based on the information about the spectral content received from the XFM processor to produce a first output signal to an adder; and
the adder combining the first output signal with a second output signal produced by the XFM processor into a composite signal c(t).

7. The audio processing apparatus according to claim 6, further comprising:
an amplifier receiving the composite signal c(t) from the adder and outputting an amplified composite signal c(t).

8. The audio processing apparatus according to claim 7, further comprising:
a loudspeaker receiving the amplified composite signal c(t) from the amplifier and generating a sound.

9. The audio processing apparatus according to claim 6, further comprising:
a battery supplying power to the XFM processor, the signal processor, the preamplifier, and the digitizer.

10. The audio processing apparatus according to claim 6, further comprising:
a speech synthesizer connected to the signal processor by a second control line and synthesizing speech to generate audible warnings in response to control signals from the signal processor.

11. The audio processing apparatus according to claim 6, wherein
the audio processing apparatus is a hearing device.

12. The audio processing apparatus according to claim 11, wherein
the hearing device is a hearing aid.

13. The audio processing apparatus according to claim 6, wherein
the audio processing device is an active ear-protection device.

14. The audio processing apparatus according to claim 6, wherein
the XFM processor includes an XFM analyzer configured to demodulate the input audio signal i(t) into the XFMR x(t) of the input audio signal i(t).

15. The audio processing apparatus according to claim 6, wherein
the XFMR representation x(t) is a set of time-varying signals including
an amplitude modulation signal a(t) representing an envelope of the digitized input audio signal i(t),
a carrier frequency signal $f_c(t)$ representing a frequency modulation carrier frequency of the digitized input audio signal i(t),
a pitch signal $f_0(t)$ representing a fundamental frequency and/or pitch of the digitized input audio signal i(t), and
a frequency modulation index signal h(t) representing a frequency modulation index of the digitized input audio signal i(t).

* * * * *